US009659871B2

(12) United States Patent
Azmat et al.

(10) Patent No.: US 9,659,871 B2
(45) Date of Patent: May 23, 2017

(54) SEMICONDUCTOR DEVICE

(71) Applicant: Samsung Electronics Co., Ltd., Suwon-si (KR)

(72) Inventors: Raheel Azmat, Suwon-si (KR); Rwik Sengupta, Hwaseong-si (KR); Chulhong Park, Seongnam-si (KR); Kwanyoung Chun, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 22 days.

(21) Appl. No.: 14/505,788

(22) Filed: Oct. 3, 2014

(65) Prior Publication Data

US 2015/0102413 A1    Apr. 16, 2015

(30) Foreign Application Priority Data

Oct. 11, 2013    (KR) .................. 10-2013-0121012

(51) Int. Cl.
| | |
|---|---|
| *H01L 27/24* | (2006.01) |
| *H01L 23/538* | (2006.01) |
| *H01L 27/118* | (2006.01) |
| *H03K 19/173* | (2006.01) |
| *H01L 27/02* | (2006.01) |

(52) U.S. Cl.
CPC .... *H01L 23/5384* (2013.01); *H01L 27/11807* (2013.01); *H03K 19/1736* (2013.01); *H01L 27/0207* (2013.01); *H01L 2924/0002* (2013.01)

(58) Field of Classification Search
CPC ................ H01L 27/0207; H01L 27/11807
USPC .................................... 257/390, 365
See application file for complete search history.

(56) References Cited

U.S. PATENT DOCUMENTS

| | | | |
|---|---|---|---|
| 6,140,687 A * | 10/2000 | Shimomura | ........ H01L 23/4824 257/390 |
| 6,410,972 B1 | 6/2002 | Sei et al. | |
| 6,690,073 B2 | 2/2004 | Umemoto et al. | |
| 6,828,632 B2 * | 12/2004 | Bhattacharyya | ........ H01L 21/84 257/288 |
| 7,685,551 B2 | 3/2010 | Toubou et al. | |
| 8,191,026 B2 | 5/2012 | Motomura | |
| 8,357,955 B2 | 1/2013 | Tanaka | |
| 8,504,972 B2 | 8/2013 | Hou et al. | |
| 8,513,978 B2 | 8/2013 | Sherlekar | |
| 2007/0200238 A1 | 8/2007 | Ikegami et al. | |
| 2007/0210391 A1 * | 9/2007 | Becker | ................ H01L 27/0207 257/390 |

FOREIGN PATENT DOCUMENTS

| | | |
|---|---|---|
| JP | 05-299508 | 11/1993 |
| JP | 2010-087336 | 4/2010 |

\* cited by examiner

*Primary Examiner* — Jerome Jackson, Jr.
*Assistant Examiner* — Bo Fan
(74) *Attorney, Agent, or Firm* — Muir Patent Law, PLLC

(57) ABSTRACT

Provided is a semiconductor device including a substrate with a plurality of logic cells, transistors provided in the plurality of logic cells, contact plugs connected to electrodes of the transistors, first via plugs in contact with top surfaces of the contact plugs, and first wires in contact with top surfaces of the first via plugs. The first wires may include a common conductive line connected to the plurality of logic cells through the contact plugs, and all of the first wires may be shaped like a straight line extending parallel to a specific direction.

10 Claims, 19 Drawing Sheets

SEMICONDUCTOR DEVICE

CROSS-REFERENCE TO RELATED APPLICATIONS

This U.S. non-provisional patent application claims priority under 35 U.S.C. §119 to Korean Patent Application No. 10-2013-0121012, filed on Oct. 11, 2013, in the Korean Intellectual Property Office, the entire contents of which are hereby incorporated by reference.

BACKGROUND OF THE INVENTION

Example embodiments of the inventive concept relate to a semiconductor device, and in particular, to a semiconductor device with a plurality of logic cells.

Semiconductor devices are increasingly being used in consumer, commercial and other electronic devices. The semiconductor devices may be classified into a memory device for storing data, a logic device for processing data, and a hybrid device including both of memory and logic elements. Due to the increased demand for electronic devices with fast speed and/or low power consumption, the semiconductor devices are designed to provide high reliability, high performance, and/or multiple functions. To satisfy these design goals, complexity and/or integration density of semiconductor devices are being increased.

SUMMARY

Example embodiments of the inventive concept provide a semiconductor device including a first wire of a unidirectional structure and thereby having an increased integration density.

Other example embodiments of the inventive concept provide a semiconductor device including contact plugs, whose disposition can be easily changed, and which have a fine pitch.

Still other example embodiments of the inventive concept provide a semiconductor device including a common conductive line of a not-shared structure and thereby having improved electrical characteristics.

According to example embodiments of the inventive concept, a semiconductor device, includes: a substrate including a plurality of logic cells; transistors provided in the plurality of logic cells; contact plugs connected to electrodes of the transistors, the contact plugs located at a first vertical level of the semiconductor device; first via plugs in contact with top surfaces of the contact plugs, the first via plugs located at a second vertical level of the semiconductor device further from the substrate than the first vertical level; and first wires in contact with top surfaces of the first via plugs, the first wires located at a third vertical level of the semiconductor device further from the substrate than the second vertical level. At least one of the first wires are connected to the plurality of logic cells through the contact plugs, and all of the first wires consist of a straight line shape extending parallel to a specific direction.

In example embodiments, each of the plurality of logic cells may include a plurality of active portions provided on the substrate to extend along a first direction, and gate structures extending along a second direction crossing the first direction.

In example embodiments, the plurality of active portions may protrude upward from a top surface of the substrate.

In example embodiments, the contact plugs may include first contact plugs connected to the plurality of active portions, and second contact plugs connected to the gate structures.

In example embodiments, the first wires may extend parallel to the first direction.

In example embodiments, some of the second contact plugs may be provided between the plurality of logic cells.

In example embodiments, each of the plurality of logic cells may include a PMOSFET region and an NMOSFET region, and in at least one of the logic cells, an adjacent pair of the second contact plugs may be spaced apart from each other with the PMOSFET region and/or the NMOSFET region interposed therebetween.

In example embodiments, each of the plurality of logic cells may include a PMOSFET region and an NMOSFET region, and the second contact plugs may include a first sub-contact plug between the PMOSFET and NMOSFET regions, a second sub-contact plug between the PMOSFET region and one of the logic cells adjacent thereto, and a third sub-contact plug between the NMOSFET region and one of the logic cells adjacent thereto.

In example embodiments, in at least one of the logic cells, an adjacent pair of the second contact plugs may be two different ones selected from the first, second, and third sub-contact plugs.

In example embodiments, the plurality of logic cells may include a first logic cell, a second logic cell separated from the first logic cell in a first direction, and a third logic cell separated from the first logic cell in a second direction crossing the first direction, and the first wires include a common conductive line shared by the first and second logic cells but not by the first and third logic cells.

In example embodiments, each of the plurality of logic cells may include a PMOSFET region and an NMOSFET region, and the first lines include a first common conductive line overlapped with a plurality of PMOSFET regions, and a second common conductive line overlapped with a plurality of NMOSFET regions.

In example embodiments, the first wires may further include conductive lines connected to the second contact plugs, and common conductive lines connected to the first contact plugs and parallel to the conductive lines.

In example embodiments, the semiconductor device may further include second via plugs on the first wires, and second wires in contact with top surfaces of the second via plugs. The second wires may extend along a direction crossing the specific direction and may be at a fourth vertical level further from the substrate than then third vertical level.

According to example embodiments of the inventive concept, an electronic device may include a substrate including a plurality of logic cells separated by a device isolation layer, a plurality of active portions provided on the substrate to extend along a first direction, gate structures extending in a second direction crossing the first direction, first contact plugs at a first vertical level and connected to the plurality of active portions, second contact plugs at the first vertical level and connected to the gate structures, and a common conductive line extending along the first direction and at a second vertical level above the first vertical level, the common conductive line connected to as set of the plurality of logic cells through a set of the first contact plugs. Some of the second contact plugs are provided on the device isolation layer between logic cells of the plurality of logic cells.

In example embodiments, each of the plurality of logic cells may include a PMOSFET region and an NMOSFET region, and in at least one of the logic cells, an adjacent pair of the second contact plugs may be spaced apart from each other with the PMOSFET region and/or the NMOSFET region interposed therebetween.

In example embodiments, each of the plurality of logic cells may include a PMOSFET region and an NMOSFET region, and the second contact plugs may include a first sub-contact plug between the PMOSFET and NMOSFET regions, a second sub-contact plug between the PMOSFET region and one of the logic cells adjacent thereto, and a third sub-contact plug between the NMOSFET region and one of the logic cells adjacent thereto.

In example embodiments, in at least one of the logic cells, an adjacent pair of the second contact plugs may be two different ones selected from the first, second, and third sub-contact plugs.

In example embodiments, the plurality of logic cells may include a first logic cell, a second logic cell separated from the first logic cell in the first direction, and a third logic cell separated from the first logic cell in the second direction, and the common conductive line may be shared by the first and second logic cells but not by the first and third logic cells.

In example embodiments, each of the plurality of logic cells may include a PMOSFET region and an NMOSFET region, and the common conductive line may include a first common conductive line overlapped with the PMOSFET region of at least two logic cells of the plurality of logic cells; and a second common conductive line overlaps with the NMOSFET region of at least the two logic cells of the plurality of logic cells.

In one embodiment, the plurality of active portions and the gate structures are part of transistors of a semiconductor device that comprises a semiconductor memory chip, a semiconductor logic chip, or a combination thereof.

In one embodiment, the semiconductor device is part of a semiconductor package, a semiconductor memory module, and/or a semiconductor memory card.

In certain embodiments, a semiconductor device includes: a substrate including a plurality of logic cells; a plurality of active portions provided on the substrate to extend along a first direction; gate structures extending along a second direction crossing the first direction, the plurality of active portions and the gate structures located at a vertical lower-level of the semiconductor device; first contact plugs connected to the plurality of active portions; second contact plugs connected to the gate structures, the first contact plugs and the second contact plugs located at a same vertical mid-level of the semiconductor device; and a common conductive line extending along the first direction and connected to at least two of the plurality of logic cells through the first contact plugs, the common conductive line located at a vertical upper level of the semiconductor device. Each of the plurality of logic cells includes active regions defined by a device isolation layer, and the common conductive line overlaps the active regions.

In example embodiments, the plurality of logic cells may include a first logic cell, a second logic cell separated from the first logic cell in the first direction, and a third logic cell separated from the first logic cell in the second direction, and the common conductive line may be shared by the first and second logic cells but not by the first and third logic cells.

In example embodiments, each of the plurality of logic cells includes a PMOSFET region and an NMOSFET region, and the common conductive line may include a first common conductive line overlapped with at least two PMOSFET regions, and a second common conductive line overlaps at least two NMOSFET regions.

In example embodiments, all conductive lines at the same vertical level as the common conductive line have a straight line shape extending only parallel to the first direction.

In example embodiments, some of the second contact plugs may be provided between the plurality of logic cells.

In example embodiments, each of the plurality of logic cells may include a PMOSFET region and an NMOSFET region, and in at least one of the logic cells, an adjacent pair of the second contact plugs may be spaced apart from each other with the PMOSFET region and/or the NMOSFET region interposed therebetween.

In example embodiments, each of the plurality of logic cells may include a PMOSFET region and an NMOSFET region, and the second contact plugs may include a first sub-contact plug between the PMOSFET and NMOSFET regions, a second sub-contact plug between the PMOSFET region and one of the logic cells adjacent thereto, and a third sub-contact plug between the NMOSFET region and one of the logic cells adjacent thereto.

In example embodiments, in at least one of the logic cells, an adjacent pair of the second contact plugs may be two different ones selected from the first, second, and third sub-contact plugs.

In example embodiments, a semiconductor device includes: a substrate including a plurality of logic cells; a plurality of active portions provided on the substrate to extend along a first direction; a plurality of active portion isolation layers extending in the first direction parallel to the plurality of active portions; additional isolation layers on the substrate, wherein some of the additional isolation layers separate adjacent logic cells from each other; gate structures extending along a second direction crossing the first direction, and disposed above at least one of the additional isolation layers; first contact plugs connected to the plurality of active portions; second contact plugs connected to the gate structures, the first contact plugs and the second contact plugs located at a same first vertical level of the semiconductor device; and a set of conductive lines extending along the first direction and including at least a first conductive line connected to a first set of first contact plugs and extending across a plurality of logic cells, and a second conductive line connected to a second set of first contact plugs, wherein the first conductive line and second conductive line are located at a same second vertical level of the semiconductor device above the first vertical level and are parallel to each other.

In one embodiment, the semiconductor device additionally includes a third conductive line connected to at least one of the first contact plugs and one of the second contact plugs, located at the second vertical level, and parallel to the first conductive line and second conductive line.

In certain embodiments, each of the plurality of logic cells comprises a PMOSFET region and an NMOSFET region, and in at least one of the logic cells, an adjacent pair of the second contact plugs are spaced apart from each other with the PMOSFET region and/or the NMOSFET region interposed therebetween.

The semiconductor device may be a semiconductor memory chip, a semiconductor logic chip, or a combination thereof.

The semiconductor device may be a semiconductor package, a semiconductor memory module, and/or a semiconductor memory card.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 7A through 10A are sectional views taken along the line I-I' of FIG. 2 to illustrate a method of fabricating a semiconductor device, according to example embodiments of the inventive concept.

FIGS. 7B through 10B are sectional views taken along the line II-II' of FIG. 2, according to an exemplary embodiment.

FIGS. 7C through 10C are sectional views taken along the line III-III' of FIG. 2, according to an exemplary embodiment.

Figure 1:
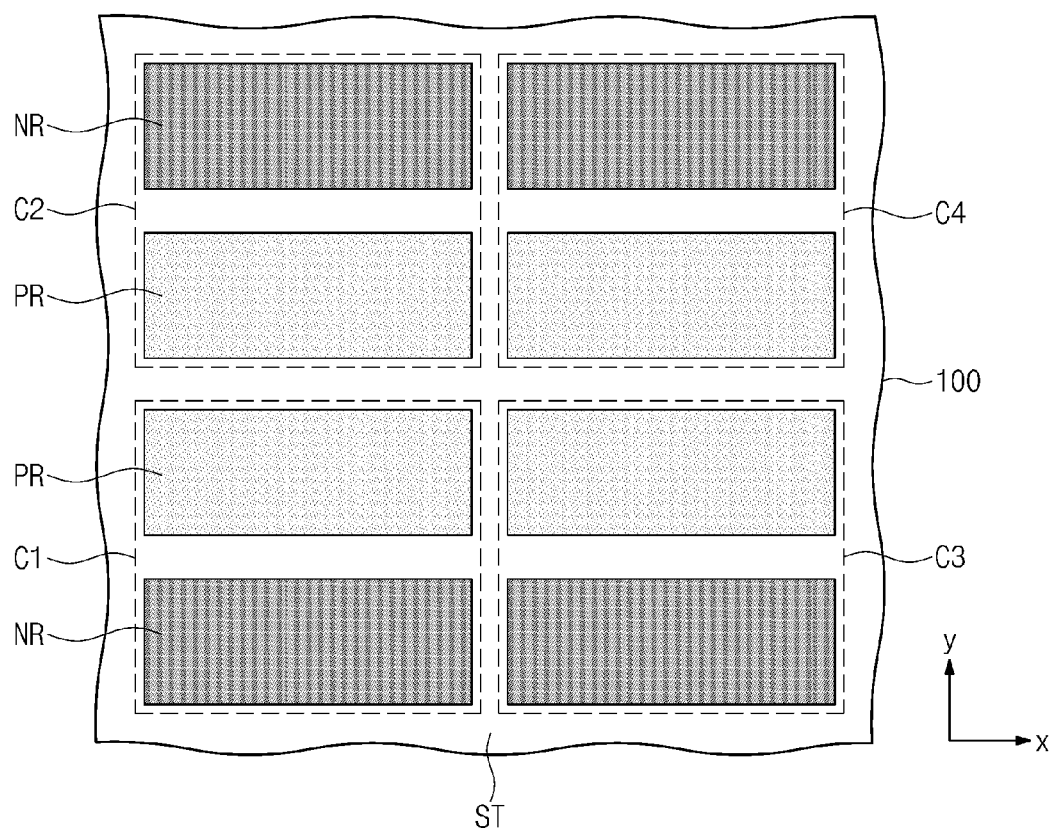
FIG. 1 is a plan view of a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature. A repeated description of some of these elements may be omitted.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. As used herein the term "and/or" includes any and all combinations of one or more of the associated listed items. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. However, the term "consisting of," specifies the presence of stated features, integers, steps, operations, elements and/or components, and precludes the presence or addition of one or more other features, integers, steps, operations, elements, components and/or groups thereof.

It will be understood that when an element is referred to as being "connected" or "coupled" to another element, it can be directly connected or coupled to the other element or intervening elements may be present. In contrast, when an element is referred to as "contacting" or being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed in one section of the specification or claims could be termed a second element, component, region, layer or section in a second section of the specification or claims, without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" or "about" may be used herein to reflect this meaning. Also, the term "consisting of" used herein may still allow for orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view of a semiconductor device according to example embodiments of the inventive concept.

A semiconductor device according to example embodiments of the inventive concept will be described with reference to FIG. 1. The semiconductor device may include a plurality of logic cells C1, C2, C3, and C4 provided on a substrate 100. Each of the logic cells C1, C2, C3, and C4 may include a plurality of transistors. For example, the semiconductor device may include a first logic cell C1, a third logic cell C3 spaced apart from the first logic cell C1 in a first direction (hereinafter, x direction), a second logic cell C2 spaced apart from the first logic cell C1 in a second direction (hereinafter, y direction) crossing the x direction, and a fourth logic cell C4 spaced apart from the second logic cell C2 in the x direction. Each of the logic cells C1, C2, C3, and C4 may include active regions delimited by a device isolation layer ST. Each of the logic cells C1, C2, C3, and C4 may include a PMOSFET region PR and an NMOSFET region NR (generally, each may be referred to as a FET region). In each of the logic cells C1, C2, C3, and C4, the PMOSFET region PR may be separated from the NMOSFET region NR by the device isolation layer ST.

As an example, the PMOSFET and NMOSFET regions PR and NR may be spaced apart from each other in the y direction. The PMOSFET region PR of the first logic cell C1 may be adjacent to the PMOSFET region PR of the second logic cell C2. In the following description, a term "logic cell" may refer to a unit circuit configured to perform a single logical operation. For example, a logic cell may be configured as an inverter, an AND gate, an OR gate, etc. The logic cell may also be configured to store data, such as a "1" or a "0".

Figure 2:
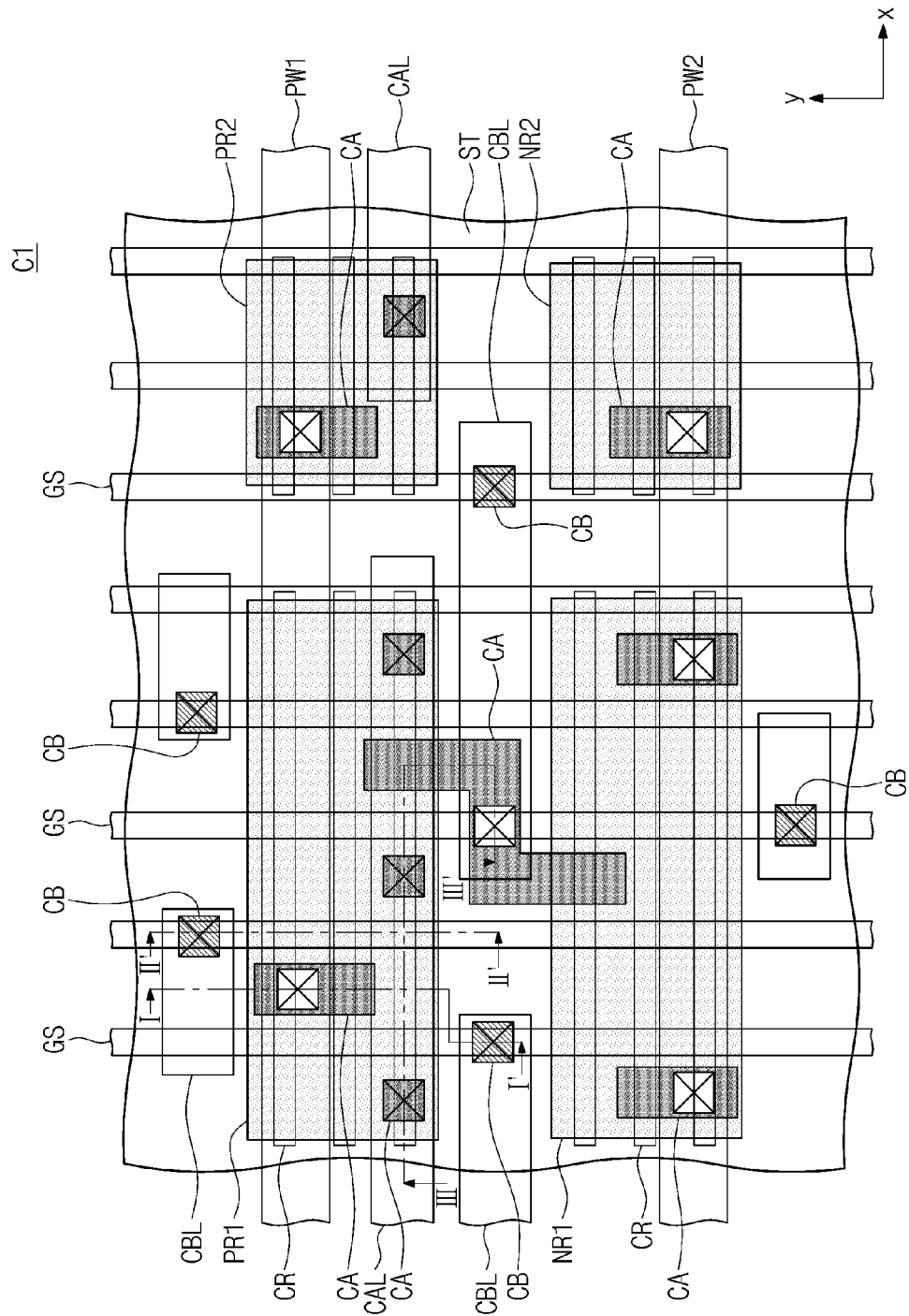
FIG. 2 is a plan view illustrating a first logic cell C1 of FIG. 1, according to an exemplary embodiment.
Figure 6A:
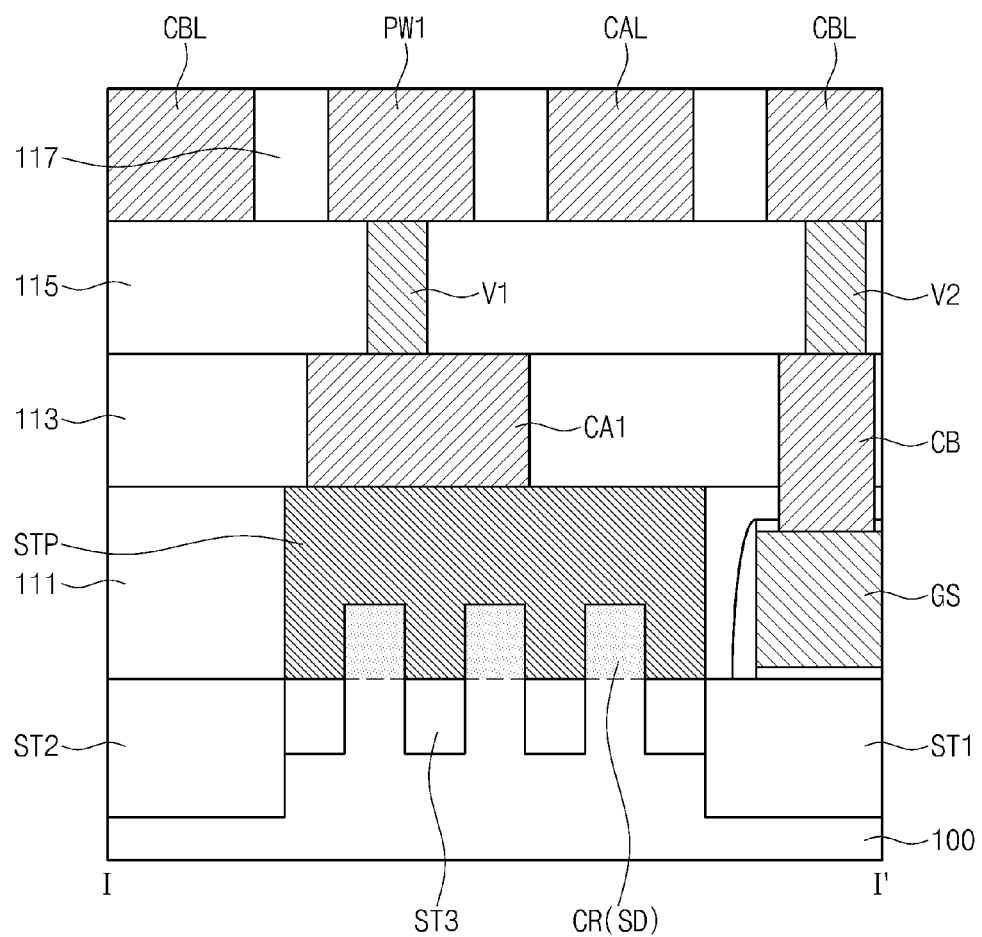
FIGS. 6A, 6B, and 6C are sectional views taken along lines I-I', II-II', and III-III', respectively, of FIG. 2, according to an exemplary embodiment.
Figure 6B:
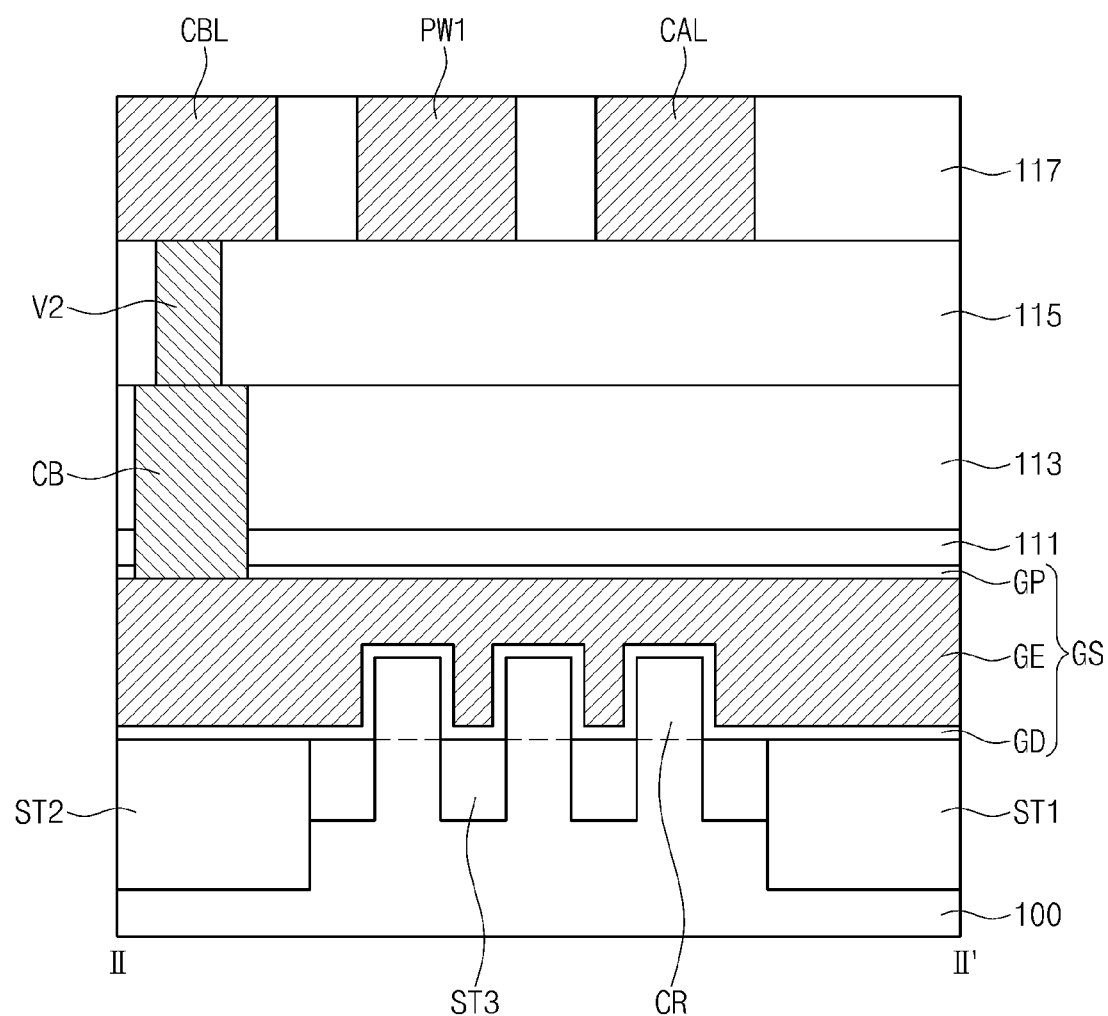
Figure 6C:
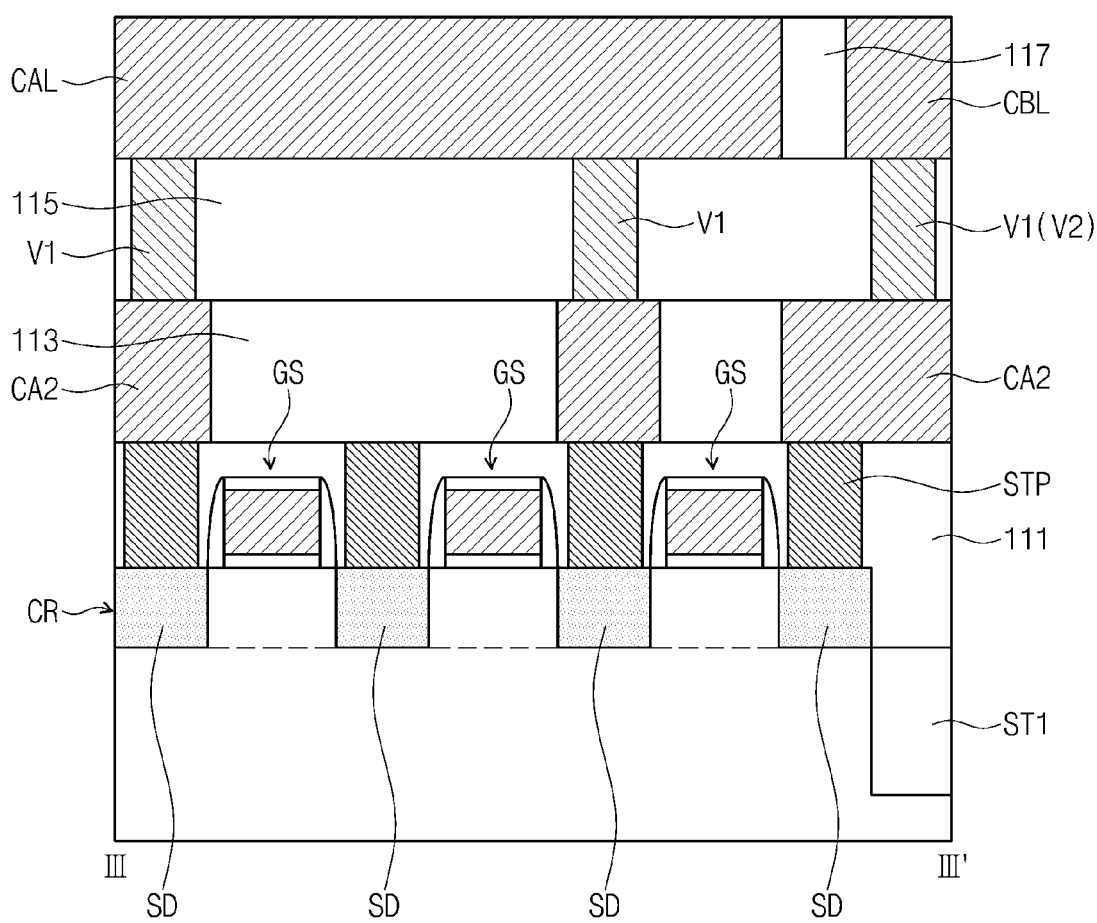

FIG. 2 is a plan view illustrating the first logic cell C1 of FIG. 1. FIGS. 6A, 6B, and 6C are sectional views taken along lines I-I', II-II', and III-III', respectively, of FIG. 2. Hereinafter, the first logic cell C1 of FIG. 1 will be exemplarily described, but other logic cells C2, C3, and C4 may be configured to have substantially the same technical features as those of the first logic cell C1.

Referring to FIGS. 1, 2, and 6A through 6C, the first logic cell C1 may include the PMOSFET and NMOSFET regions PR and NR separated apart from each other by the device isolation layer ST. The first logic cell C1 may be separated from other logic cells C2, C3, and C4 adjacent thereto by the device isolation layer ST. The device isolation layer ST may include a first device isolation layer ST1 separating the PMOSFET and NMOSFET regions PR and NR from each other and a second device isolation layer ST2 separating the first logic cell C1 from other adjacent logic cells C2, C3, and C4 adjacent thereto. The first and second device isolation layers ST1 and ST2 may be substantially connected to each other, thereby constituting a single insulating layer. The device isolation layer ST may be formed on the substrate 100. The substrate 100 may be, for example, a silicon wafer, a germanium wafer, or a silicon-on-insulator (SOI) wafer. The device isolation layer ST may include, for example, a silicon oxide layer.

For example, in the first logic cell C1, the PMOSFET region PR may include a plurality of PMOSFET regions PR1 and PR2 separated from each other in the x direction by the device isolation layer ST. The NMOSFET region NR may include a plurality of NMOSFET regions NR1 and NR2 separated from each other in the x direction by the device isolation layer ST. In other example embodiments, the first logic cell C1 may include one PMOSFET region PR and one NMOSFET region NR.

The first logic cell C1 may include a plurality of active portions CR provided on the substrate 100 to extend along the x direction. For example, third device isolation layers ST3 may extend along the x direction, and each of the active portions CR may be shaped like a fin protruding between two of the third device isolation layers ST3. A thickness of the third device isolation layers ST3 may be thinner than a thickness of each of the first and second device isolation layers ST1 and ST2 (for example in a vertical direction). In this case, the third device isolation layers ST3 may be formed using a process that is different from that for the first and second device isolation layers ST1 and ST2. In other example embodiments, the third device isolation layers ST3may be concurrently formed with the first and second device isolation layers ST1 and ST2 and may have substantially the same thickness. Because the device isolation layers ST1 and ST2 separate NMOSFET regions NR from PMOSFET regions PR or separate different logic cells from each other, these device isolation layers ST1 and ST2 may be referred to as cell isolation layers or doped area isolation layers. Because the device isolation layers ST3separate active portions from each other, they may be referred to as active portion isolation layers, or active region isolation layers.

The active portions CR may be provided on the PMOSFET and NMOSFET regions PR and NR, respectively. As shown, the number of the active portions CR on each of the active regions PR and NR may be three, but example embodiments of the inventive concept are not limited thereto. Other numbers of active portions may be included in each FET region, or different numbers of active portions may be in the PMOSFET regions PR than in the NMOSFET regions NR.

Gate structures GS may be provided on the active portions CR to cross the active portions CR and extend along the y direction. Each of the gate structures GS may extend along the y direction and cross the PMOSFET region PR and the NMOSFET region NR. Each of the gate structures GS may include a gate insulating layer GD, a gate electrode GE, and a capping layer GP sequentially stacked on the substrate 100. The gate insulating layer GD may include, for example, at least one of a silicon oxide layer, a silicon oxynitride layer, and a high-k dielectric whose dielectric constant is higher than a silicon oxide layer. The gate electrode GE may include, for example, at least one of a doped semiconductor layer, a metal layer, and a conductive metal nitride layer. The capping layer GP may include, for example, at least one of a silicon oxide layer, a silicon nitride layer, and a silicon oxynitride layer.

Source/drain regions SD may be provided in or on the active portions CR. As shown in FIG. 6A, the source/drain regions SD may be confined within the active portions CR, but in certain embodiments, the source/drain regions SD may extend into the substrate 100 (for example, between the third device isolation layers ST3). The source/drain regions SD in the PMOSFET region PR may be p-type impurity regions, and the source/drain regions SD in the NMOSFET region NR may be n-type impurity regions.

The source/drain regions SD may be formed in or on the active portions CR, and the active portions CR may be separated from each other in the y direction by the third device isolation layers ST3. In the PMOSFET region PR, the source/drain regions SD spaced apart from each other in the y direction may be connected to each other by conductive connection patterns STP. For example, the conductive connection patterns STP may be formed on the active portions CR to connect the source/drain regions SD separated from each other in the y direction. The conductive connection patterns STP may be directly connected to the active portions CR. The source/drain regions SD in the NMOSFET region NR may be connected to each other, in substantially the same manner, by the conductive connection patterns STP. For example, in the NMOSFET region NR, the source/drain regions SD spaced apart from each other in the y direction may be connected to each other by the conductive connection patterns STP.

The conductive connection patterns STP may include, for example, a metal silicide. As an example, the conductive connection patterns STP may include at least one of titanium silicide, tantalum silicide, or tungsten silicide. The conductive connection patterns STP may further include a metal layer. As an example, the metal layer may include at least one of titanium, tantalum, or tungsten. As an example, the conductive connection patterns STP may include a metal silicide layer and a metal layer on the metal silicide layer. The conductive connection patterns STP may be provided in a first interlayered insulating layer 111. The first interlayered insulating layer 111 may include, for example, at least one of a silicon oxide layer or a silicon oxynitride layer.

First contact plugs CA may be provided on the conductive connection patterns STP. The first contact plugs CA may be connected to the source/drain regions SD. The first contact plugs CA may be in contact with top surfaces of the conductive connection patterns STP. The first contact plugs CA may include, for example, at least one of doped semiconductors, metals, or conductive metal nitrides. The first contact plugs CA may have various shapes. For example, at least one of the first contact plugs CA may be shaped like a bar extending along the y direction. For example one or more first contact plugs CA may extend further in one direction (e.g., a y direction) than in another direction (e.g. an x direction). Some of the first contact plugs CA may extend above the device isolation layer ST and connect the source/drain region SD of the PMOSFET region PR to the source/drain region SD of the NMOSFET region NR. The first contact plugs CA connecting the source/drain regions SD of the PMOSFET and NMOSFET regions PR and NR may include a portion extending along the y direction and another portion extending along the x direction. In one embodiment, a first contact plug CA connection a source/drain regions SD of the PMOSFET and NMOSFET regions PR and NR has a z-shape.

Second contact plugs CB may be provided on and electrically connect to the gate structures GS. The second contact plugs CB may be directly connected to the gate electrode GE of the gate structures GS. In certain embodiments, the second contact plugs CB may be positioned at substantially the same vertical level as the first contact plugs CA. The first contact plugs CA and the second contact plugs CB may include at least one of doped semiconductors, metals, or conductive metal nitrides. The first and second contact plugs CA and CB may be provided in a second interlayered insulating layer 113. The second interlayered insulating layer 113 may include, for example, at least one of a silicon oxide layer or a silicon oxynitride layer. Hereinafter, the disposition of the second contact plugs CB will be described in more detail.

Figure 3:
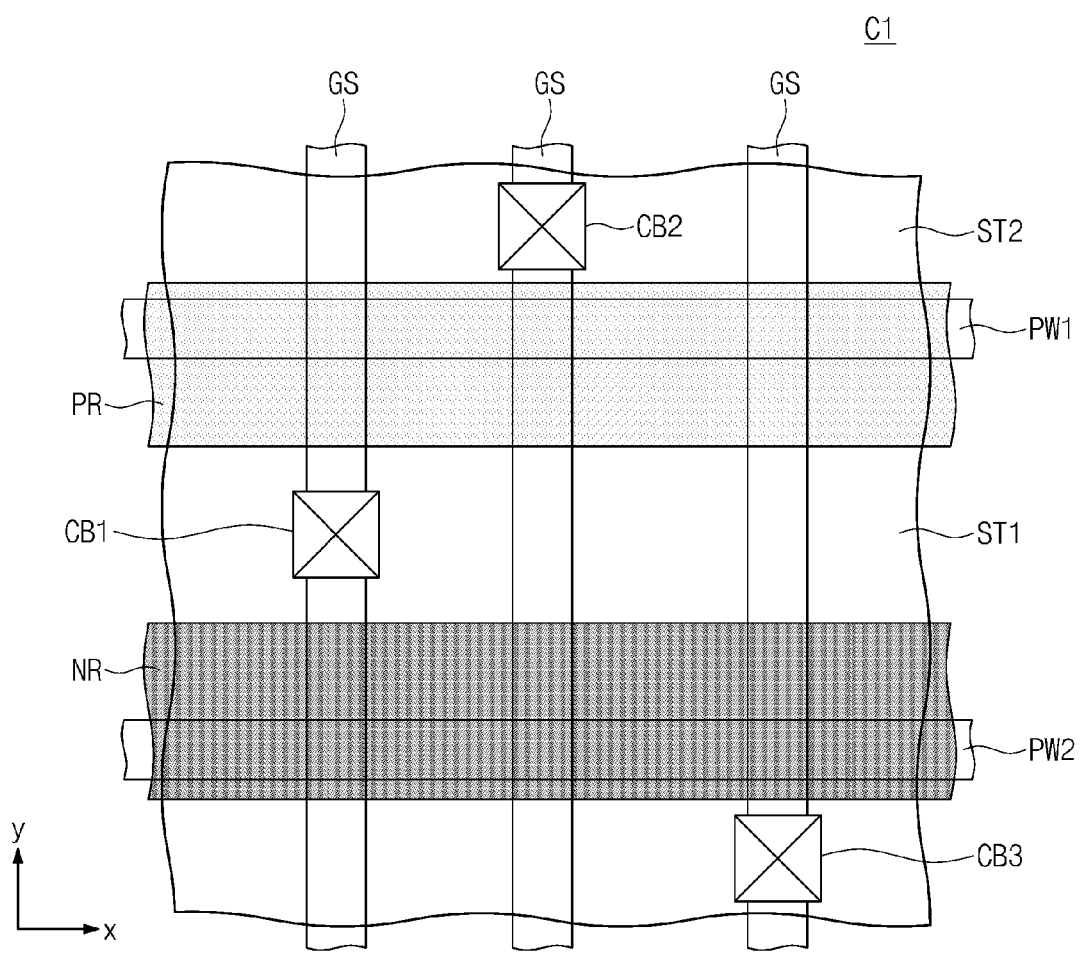
FIG. 3 is a plan view schematically illustrating second contact plugs CB of the first logic cell C1, according to an exemplary embodiment.

FIG. 3 is a plan view schematically illustrating the second contact plugs CB of the first logic cell C. The second contact plugs CB may include a first sub-contact plug CB1 provided between the PMOSFET and NMOSFET regions PR and NR of the first logic cell C1. The first sub-contact plug CB1 may be provided on the first device isolation layer ST1. The second contact plugs CB may further include sub-contact plugs CB2 and CB3 provided on the second device isolation layer ST2 between adjacent logic cells. For example, the sub-contact plugs CB2 and CB3 may be provided between the first logic cell C1 and other logic cells separated from the first logic cell C1 in the y direction. As an example, the second contact plugs CB may include a second sub-contact plug CB2, which is disposed between the PMOSFET region PR of the first logic cell C1, and another logic cell adjacent in the y direction and/or a third sub-contact plug CB3, which is disposed between the NMOSFET region NR of the first logic cell C1 and another logic cell adjacent in the y direction. The first logic cell C1 may be configured to include all of the first, second, and third sub-contact plugs CB1, CB2, and CB3, but example embodiments of the inventive concepts not limited thereto. For example, two of the first to third sub-contact plugs CB1, CB2, and CB3 may be provided in the first logic cell C1. As an example, the first logic cell C1 may include the first sub-contact plug CB1 and the second sub-contact plug CB2 or may include the first sub-contact plug CB1 and the third sub-contact plug CB3.

An adjacent pair of the second contact plugs CB may refer to two different ones of the first to third sub-contact plugs CB1, CB2, and CB3. In certain embodiments, the adjacent pair of the second contact plugs CB may be separated from each other by the PMOSFET region PR and/or the NMOSFET region NR. For example, the adjacent pair of the second contact plugs CB may be the first and second sub-contact plugs CB1 and CB2, the first and third sub-contact plugs CB1 and CB3, or the second and third sub-contact plugs CB2 and CB3. The disposition of the first to third sub-contact plugs CB1, CB2, and CB3 will not be limited to that of the example illustrated in FIG. 3 and may be variously changed in consideration of disposition of wires, which will be described below.

In the case where the second contact plugs CB are provided as described above, it is possible to reduce the number of masks required for forming the second contact plugs CB. For example, if in the first logic cell C1, all of the second contact plugs CB are disposed between the PMOSFET and NMOSFET regions PR and NR, the second contact plugs CB should be formed in such a way that a distance between them is greater than a minimum pitch that can be realized through a photolithography technology. Although such a limitation may be overcome by using a plurality of masks, the use of the plurality of masks may lead to an increase in fabrication cost of the semiconductor device. By contrast, according to example embodiments of the inventive concept, it may be unnecessary to form at least one of the second contact plugs CB between the PMOSFET and NMOSFET regions PR and NR, and thus, by using only one photo mask, it is possible to form the second contact plugs CB that are spaced apart from each other in the distance greater than the minimum pitch.

As shown in FIG. 3, the first logic cell C1 may include a first common conductive line PW1 overlapped with the PMOSFET region PR and a second common conductive line PW2 overlapped with the NMOSFET region NR. The first and second common conductive lines PW1 and PW2 may extend along the x direction and may be shared by logic cells adjacent in the x direction. However, in some embodiments, the first and second common conductive lines PW1 and PW2 may not be shared by logic cells adjacent in the y direction. For example, the first common conductive line PW1 may be electrically connected to the PMOSFET region PR of the first logic cell C1 but the second logic cell C2 adjacent to the first logic cell C1 in the y direction may not be electrically connected to the first common conductive line PW1 provided on the first logic cell C1. Therefore, the first and second logic cells C1 and C2 may be configured not to share the first common conductive line PW1. Such an un-shared structure allows for reduction in the amount of electric current to be supplied thereto, compared with a shared structure including a common conductive line shared by logic cells adjacent in the y direction, and thus, the un-shared structure may be advantageous in terms of electro-migration and IR drop characteristics.

For adjacent logic cells illustrated in FIG. 1, the active regions with the same conductivity type are disposed adjacent to each other, but in the un-shared structure, the active regions with the same conductivity type can be arranged to be not adjacent to each other. In the example shown in FIG. 1, the PMOSFET region PR of the first logic cell C1 is provided adjacent to the PMOSFET region PR of the second logic cell C2 in the y direction, but according to other example embodiments of the inventive concept, the PMOSFET region PR of the first logic cell C1 may be provided adjacent to the NMOSFET region NR of the second logic cell C2 in the y direction.

Figure 4:
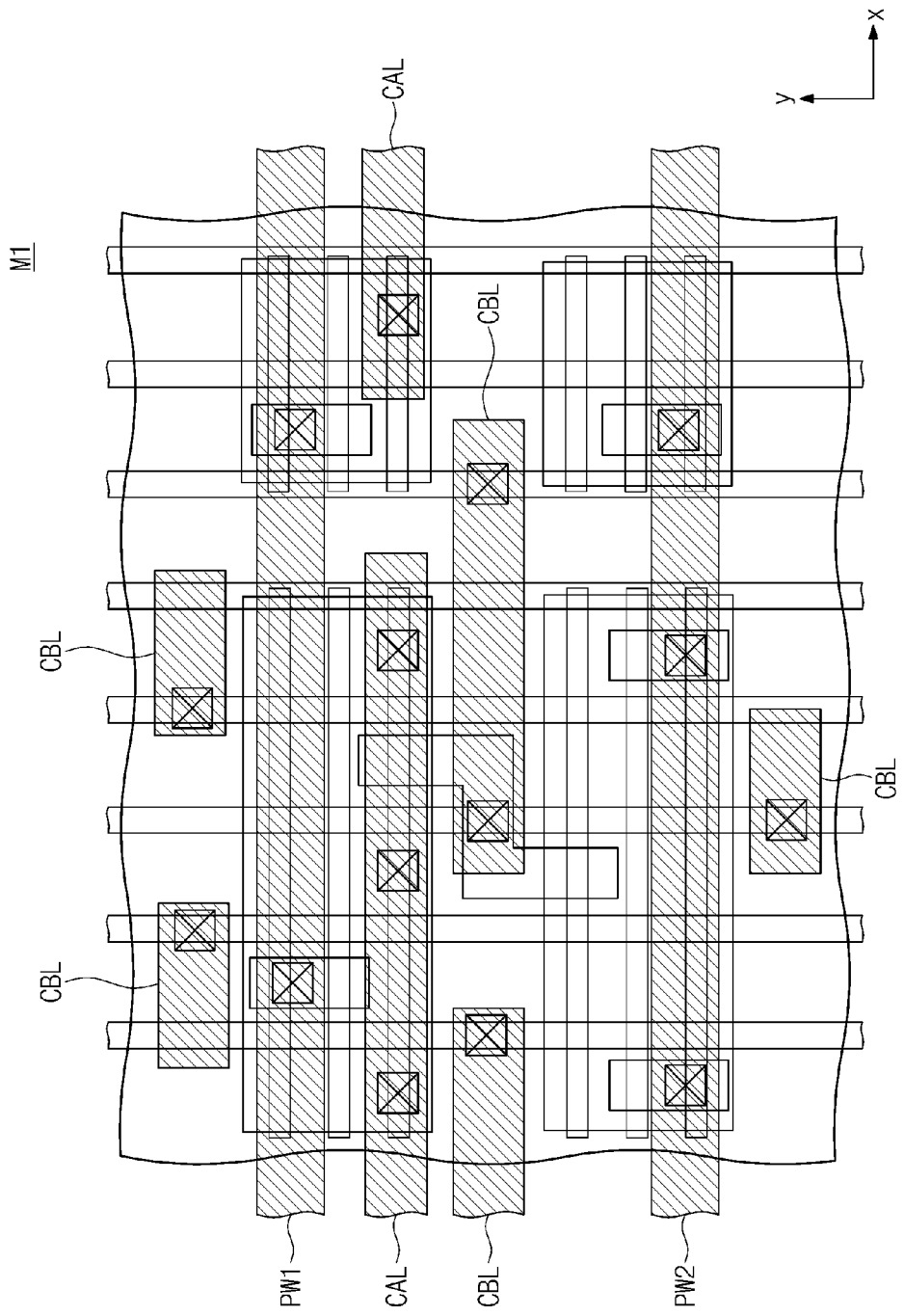
FIG. 4 is a plan view illustrating first wires M1 of the first logic cell C1, according to an exemplary embodiment.

FIG. 4 is an exemplary plan view illustrating first wires M1 of the first logic cell C1. FIG. 4 illustrates the same region as that of FIG. 2, but in order to more clearly illustrate the position and the shape of the first wires M1, the first wires M1 are depicted with the same hatching. In the present specification, the first wires M1 may refer to the common conductive lines PW1 and PW2 and conductive layers, which are provided at substantially the same level as those of the common conductive lines PW1 and PW2.

The structure of the first wires M1, according to example embodiments of the inventive concept, will be described with reference to FIGS. 1 through 4 and FIGS. 6A through 6C.

Each of the common conductive lines PW1 and PW2 may be connected to a set of at least one of the first contact plugs CA. For example, the common conductive lines PW1 and PW2 may be in contact with top surfaces of the first contact plugs CA, or alternatively may connect to top surfaces of the first contact plugs CA through via plugs. Hereinafter, one of the first contact plugs CA connected to the common conductive lines PW1 or PW2 will be referred to as a "common conductive contact plug CA1", and the remaining one(s) of the first contact plugs CA, except for the common conductive contact plug CA1, will be referred to as an "individual conductive contact plug(s) CA2".

For example, the first common conductive line PW1 on the PMOSFET region PR may be connected to one common conductive contact plug CA1, and the second common conductive line PW2 on the NMOSFET region NR may be connected to two common conductive contact plugs CA1. There may be various modifications in terms of the number and the position of the common conductive contact plugs CA1 connected to the first and second common conductive lines PW1 and PW2, depending on a type and/or a design rule of the semiconductor device. In one embodiment, the common conductive lines PW1 and PW2 may be connected to the first contact plugs CA through first via plugs V1, respectively. The first via plugs V1 may be provided in a third interlayered insulating layer 115, and the common conductive lines PW1 and PW2 may be provided in a fourth interlayered insulating layer 117. Each of the third and fourth interlayered insulating layers 115 and 117 may include at least one of a silicon oxide layer and a silicon oxynitride layer. In other example embodiments, the first via plugs V1 may not be provided in the third interlayered insulating layer 115, and the common conductive lines PW1 and PW2 may be directly connected to the common conductive contact plugs CA1.

In the PMOSFET region PR, the first common conductive line PW1 may be configured to provide a drain voltage Vdd (e.g., a power voltage) to the source/drain regions SD through the first via plugs V1, the common conductive contact plug CA1, and the conductive connection patterns STP. In the NMOSFET region NR, the second common conductive line PW2 may be configured to provide a source voltage Vss (e.g., a ground voltage) to the source/drain regions SD through the first via plugs V1, the common conductive contact plugs CA1, and the conductive connection patterns STP. In this description, one of the drain voltage Vdd and the source voltage Vss may be referred to as a first voltage, and the other of the drain voltage Vdd and the source voltage Vss may be referred to as a second voltage.

Some of the individual conductive contact plugs CA2, which are disconnected from the first and second common conductive lines PW1 and PW2, may be connected to first conductive lines CAL. For example, a set of these individual conductive contact plugs CA2 may be connected to first conductive lines CAL. The first conductive lines CAL may be in contact with top surfaces of the individual conductive contact plugs CA2, or alternatively, the individual conductive contact plugs CA2 may be coupled to the first conductive lines CAL through the first via plugs V1. Each of the first conductive lines CAL may connect a set of a plurality of the individual conductive contact plugs CA2 to each other, and the individual conductive contact plugs CA2 connected to each of the first conductive lines CAL may provide the substantially same voltage to the source/drain regions SD.

Second conductive lines CBL may be connected to the second contact plugs CB. The second conductive lines CBL may be in contact with top surfaces of the second contact plugs CB, or alternatively may connect to top surfaces of the second contact plugs CB through via plugs. The second conductive lines CBL may be used, for example, to apply a gate voltage to the gate structures GS through second via plugs V2 and the second contact plugs CB. The second contact plugs CB may be coupled to the gate electrodes GE through the capping layer GP. In the case where the second contact plugs CB contain a semiconductor material, an ohmic layer may be provided between the second contact plugs CB and the gate electrodes GE. In one embodiment, the second conductive lines CBL also connect to a first contact plug CA, as can be seen, for example, from FIGS. 2 and 6C. As such, a set of first contact plugs CA and second contact plugs CB may connect to a second conductive line CBL.

The common conductive lines PW1 and PW2, the first conductive lines CAL, and the second conductive lines CBL may be the first wires M1 provided at the same level. As shown in FIG. 4, the first wires M1 may be configured to have a unidirectional structure. In the present specification, the unidirectional structure may refer to a structure (e.g., a straight line or bar) that is elongated along a specific direction and does not have a protruding portion crossing the specific direction or bending to a different direction. The first wires M1 may be parallel to each other, for example extending lengthwise in a single direction only (e.g., an x direction).

In the case where the first wires M1 are formed to have the unidirectional structure, it is possible to reduce an area required for a routing or interconnection, compared with a multidirectional structure, and thus, the semiconductor device can have an increased integration density. In the case where the first wires M1 are formed to have the multidirectional structure, the first wires M1 should be formed in consideration of both of spacing distances in the x and y directions. By contrast, in the case where the first wires M1 are formed to have the unidirectional structure, it may be sufficient to take into consideration only a spacing distance in a specific direction (e.g., the y direction). Further, if the first wires M1 are formed to have a multidirectional structure, an additional routing area may be needed to prevent the first wires M1 from intersecting at the same level. However, in the case where the first wires M1 are formed to have the unidirectional structure, it is possible to prevent the increase of the routing area. In addition, in the case where the first wires M1 are formed to have the unidirectional structure, a process capable of reducing widths of the first wires M1 can be used, as will be described below.

Figure 5:
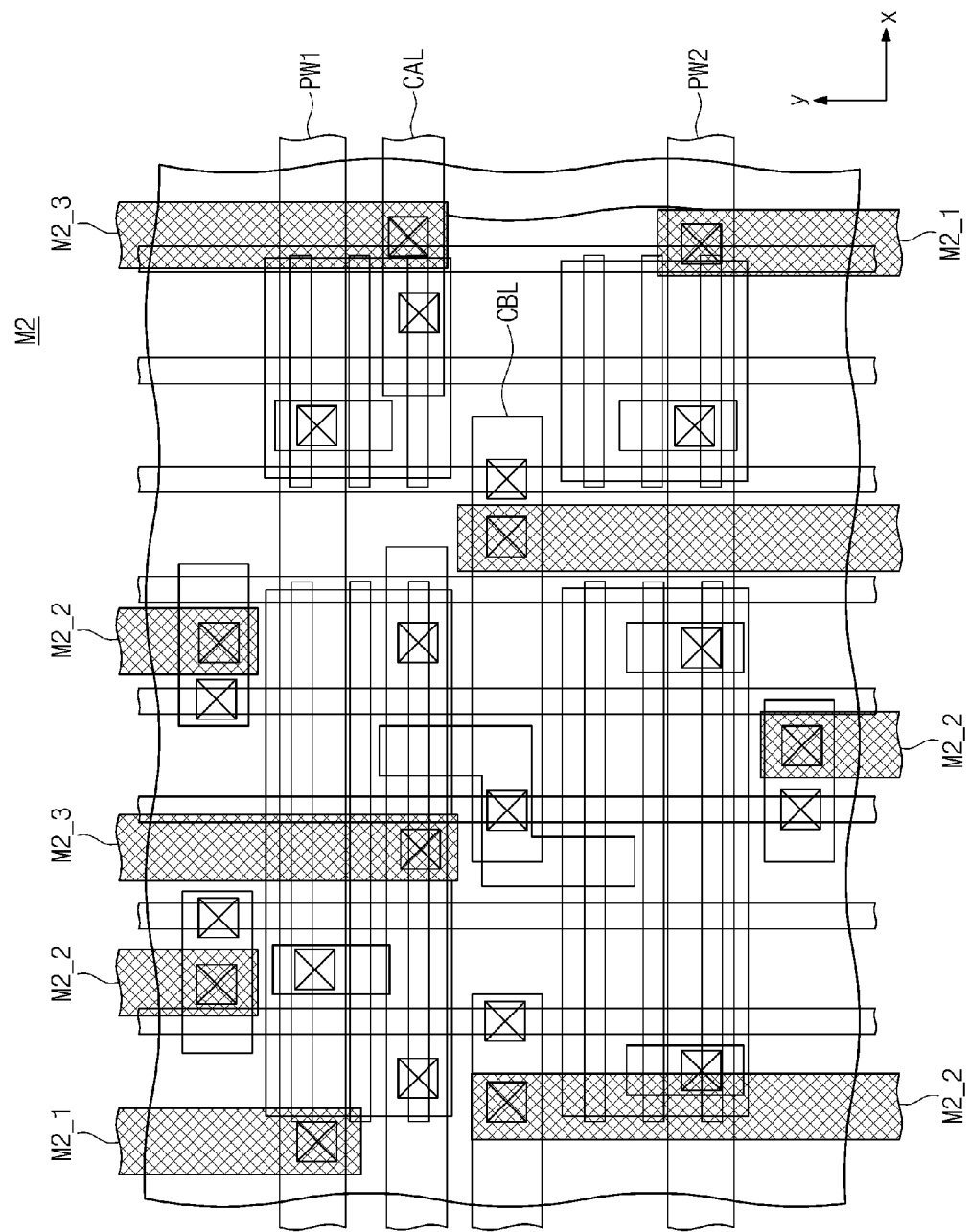
FIG. 5 is a plan view illustrating second wires M2 of the first logic cell C1, according to an exemplary embodiment.

FIG. 5 is a plan view illustrating second wires M2 of the first logic cell C1. The second wires M2 may be provided on the first wires M1 and may be connected to the first wires M1 through via plugs. The second wires M2 may include first subsidiary wires M2_1 connected to the common conductive lines PW1 and PW2, second subsidiary wires M2_2 connected to the second conductive lines CBL, and third subsidiary wires M2_3 connected to the first conductive lines CAL. The second wires M2 may have the unidirectional structure with respect to each other. In the case where the second wires M2 are formed to have the unidirectional structure, it is possible to reduce an area required for a routing or interconnection, compared with the multidirectional structure, and thus, the semiconductor device can have an increased integration density. The first and second wires M1 and M2 may include at least one of doped semiconductors, metals, or conductive metal nitrides. For example, the first and second wires M1 and M2 may each include at least one of copper (Cu), aluminum (Al), gold (Au), silver (Ag), tungsten (W), titanium (Ti), titanium nitride (TiN), or tungsten nitride (WN).

As indicated above, each logic cell C1, C2, C3, or C4 may include two sets of unidirectional wires at different vertical levels of the logic cell. The first set of unidirectional wires may connect to certain elements of the logic cell and may include individual wire portions extending lengthwise in a first direction (e.g., the x direction) and the second set of unidirectional wires may connect to certain elements of the logic cell and may include individual wire portions extending lengthwise in a second direction (e.g., the y direction, which may be perpendicular to the x direction).

FIGS. 7A through 10A are sectional views taken along the line I-I' of FIG. 2 to illustrate a method of fabricating a semiconductor device, according to example embodiments of the inventive concept. FIGS. 7B through 10B are sectional views taken along the line II-IF of FIG. 2, and FIGS. 7C through 10C are sectional views taken along the line III-III' of FIG. 2.

Figure 7A:
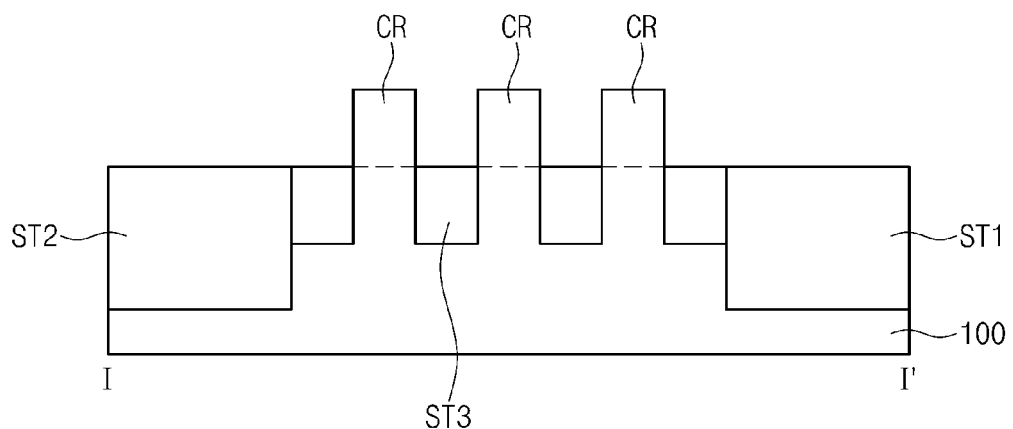
Figure 7B:
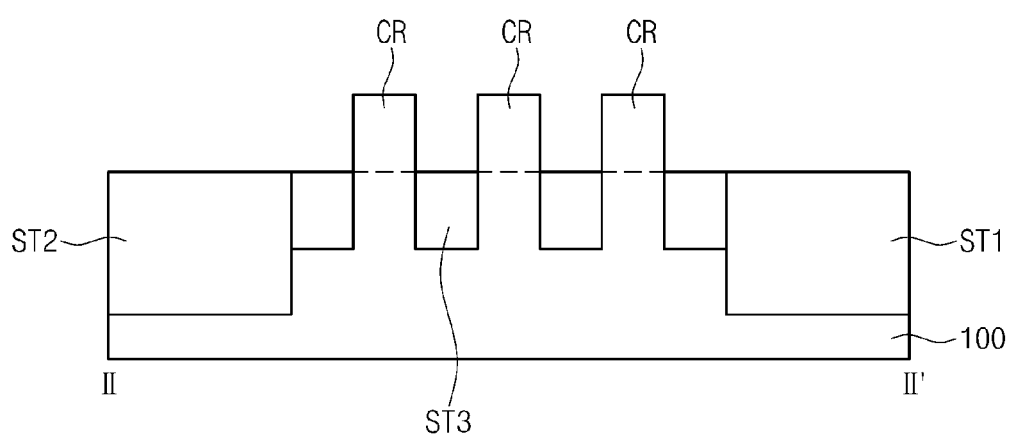
Figure 7C:
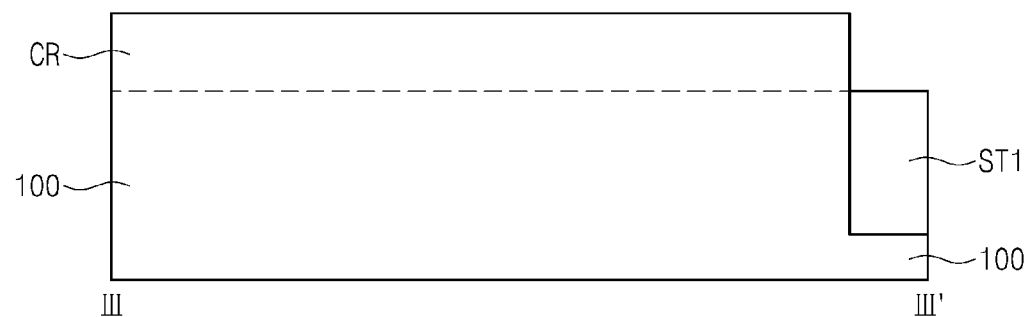

Referring to FIGS. 7A through 7C in conjunction with FIG. 2, the active portions CR may be formed on the substrate 100. In example embodiments, the substrate 100 may be, for example, a silicon wafer, a germanium wafer, or a silicon-on-insulator (SOI) wafer. For example, the third device isolation layers ST3 may be formed to be parallel to the x direction, and each of the active portions CR may be shaped like a fin protruding between the third device isolation layers ST3. The formation of the active portions CR may include, for example, forming a trench in the substrate 100 by etching an upper portion of the substrate 100), and then forming insulating patterns in the trench and etching an upper portion of the insulating patterns to expose sidewalls of the substrate 100 between the insulating patterns.

The first and second device isolation layers ST1 and ST2 may be formed on the substrate 100. The first device isolation layer ST1 may be formed parallel to the x direction to separate the PMOSFET and NMOSFET regions PR and NR of the first logic cell C1 from each other. The second device isolation layer ST2 may be formed parallel to the x direction to separate the first logic cell C1 from neighboring logic cells. The second device isolation layer ST2 may be formed to have a width greater than that of the first device isolation layer ST1. The first and second device isolation layers ST1 and ST2 may be formed, for example, by a shallow-trench-isolation (STI) process. The first and second device isolation layers ST1 and ST2 may include, for example, a silicon oxide layer. Further, the first and second device isolation layers ST1 and ST2 may be formed to be thicker than the third device isolation layers ST3. In other example embodiments, the first to third device isolation layers ST1, ST2, and ST3may be concurrently formed to have substantially the same thickness.

Figure 8A:
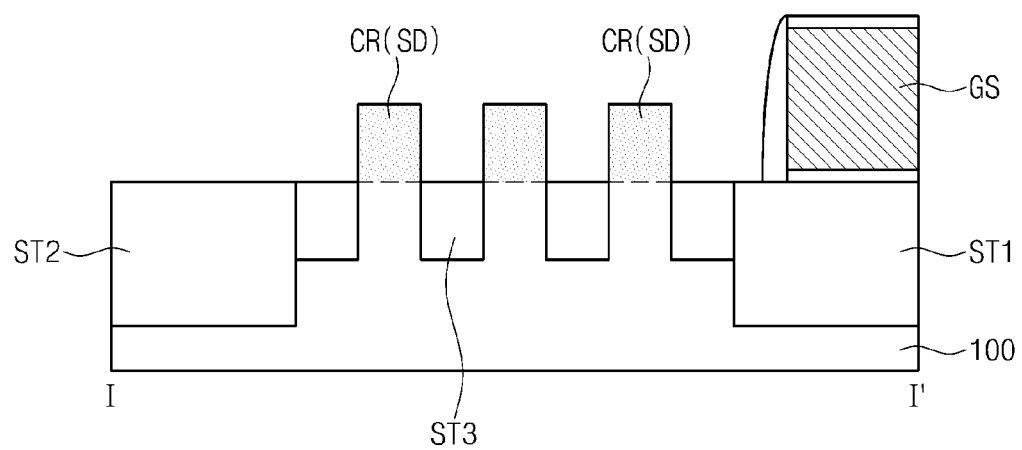
Figure 8B:
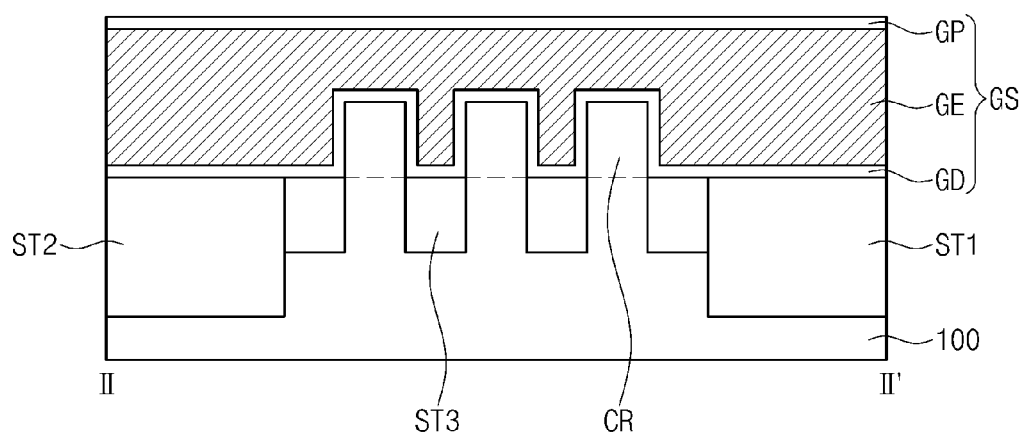
Figure 8C:
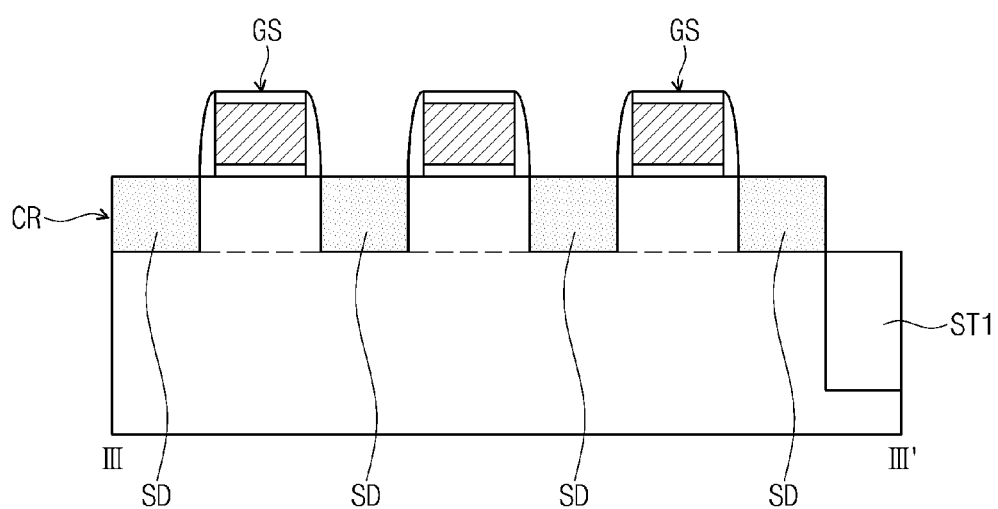

Referring to FIGS. 8A through 8C in conjunction with FIG. 2, the gate structures GS may be formed to cross the active portions CR or extend along the y direction. The gate structures GS may include the gate insulating layer GD, the gate electrode GE, and the capping layer GP that are sequentially formed on the active portions CR. The formation of the gate structures GS may include forming an insulating layer and a conductive layer on the active portions CR and then performing a patterning process thereto. The insulating layer may include, for example, at least one of a silicon oxide layer, a silicon oxynitride layer, or a high-k dielectric whose dielectric constant is higher than a silicon oxide layer. The conductive layer may include at least one of doped semiconductors, metals, or conductive metal nitrides. The insulating layer and the conductive layer may be formed, for example, using a chemical vapor deposition and/or a sputtering process. The capping layer GP may be formed of at least one of a silicon oxide layer, a silicon nitride layer, or a silicon oxynitride layer.

An ion implantation process may be performed to the structure with the gate structures GS to form the source/drain regions SD. The gate structures GS may be used as an ion mask, during the ion implantation process, and thus, the source/drain regions SD may be formed in portions of the active portions CR, which are not covered with the gate structures GS. In certain embodiments, doped regions (e.g., the source/drain regions SD) and un-doped regions may be alternately formed in each active portion CR.

In the PMOSFET region PR, the source/drain regions SD may be formed by injecting p-type impurities into the active portions CR, and in the NMOSFET region NR, the source/drain regions SD may be formed by injecting n-type impurities into the active portions CR.

Figure 9A:
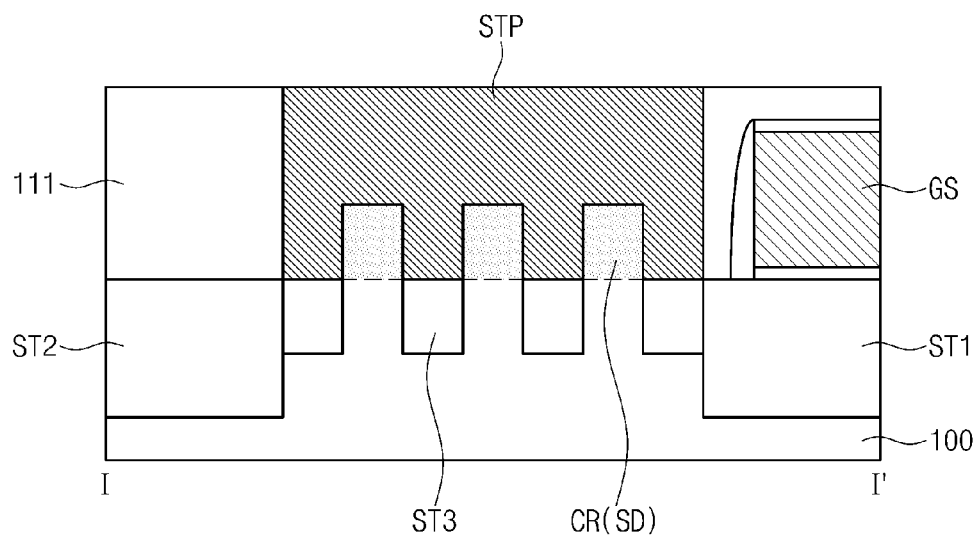
Figure 9B:
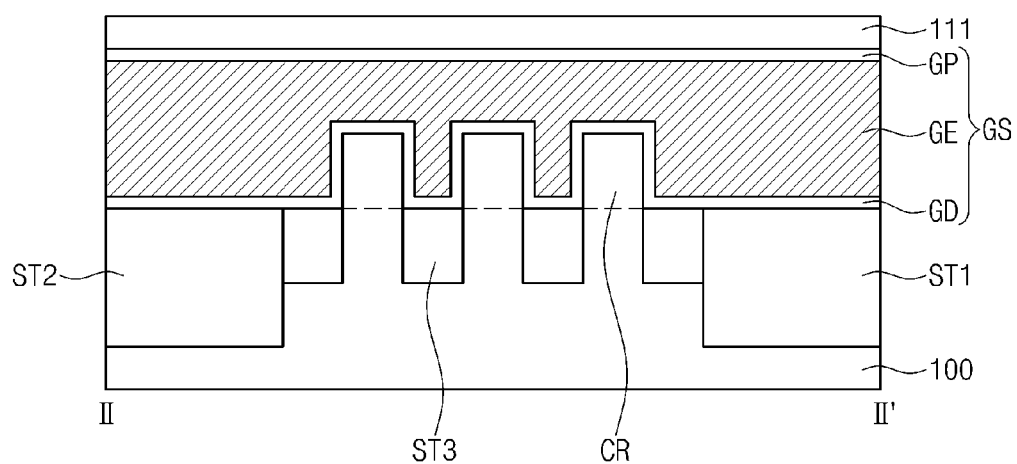
Figure 9C:
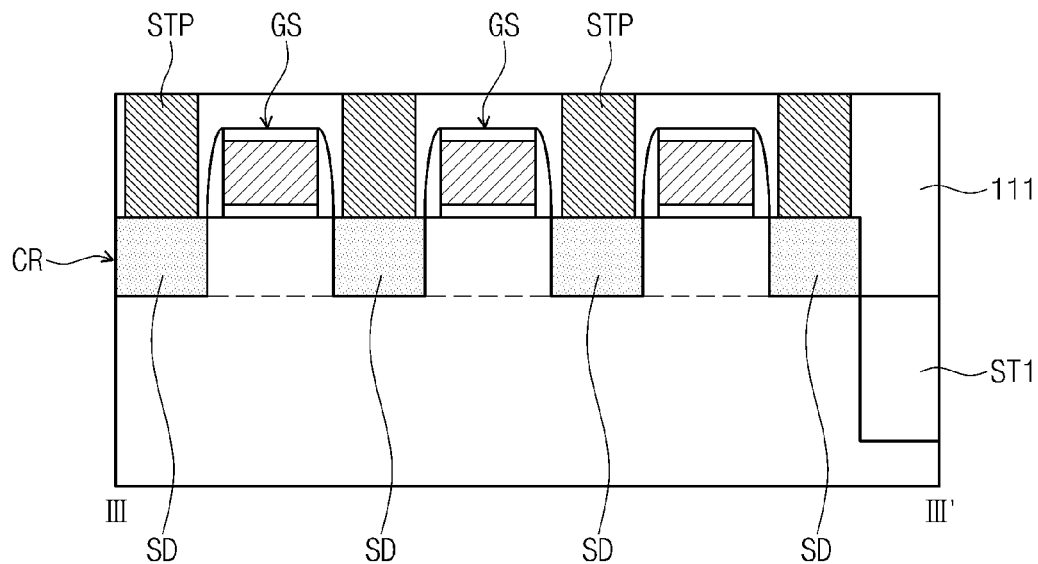

Referring to FIGS. 9A through 9C in conjunction with FIG. 2, the first interlayered insulating layer 111 may be formed to cover the gate structures GS, and then, the conductive connection patterns STP may be formed to penetrate the first interlayered insulating layer 111 and be in contact with the source/drain regions SD. The first interlayered insulating layer 111 may include, for example, at least one of a silicon oxide layer or a silicon oxynitride layer. The formation of the conductive connection patterns STP may include forming recess regions penetrating the first interlayered insulating layer 111 and exposing the active portions CR and then filling the recess regions with a conductive material. The conductive connection patterns STP may include, for example, metal silicide. For example, the conductive connection patterns STP may include at least one of titanium silicide, tantalum silicide, or tungsten silicide. The conductive connection patterns STP may further include a metal layer. As an example, the metal layer for the conductive connection patterns STP may include at least one of titanium, tantalum, or tungsten. As an example, the conductive connection patterns STP may be formed to include a metal silicide layer and a metal layer on the metal silicide layer.

In the PMOSFET region PR, the source/drain regions SD spaced apart from each other in the y direction may be connected to each other by conductive connection patterns STP. For example, the source/drain regions SD may be formed in or on the active portions CR, and the active portions CR may be separated from each other in the y direction by the third device isolation layers ST3. The conductive connection patterns STP may be formed on the active portions CR, respectively, to connect the source/drain regions SD separated from each other in the y direction. The source/drain regions SD in the NMOSFET region NR may be connected to each other in substantially the same manner, by the conductive connection patterns STP. For example, in the NMOSFET region NR, the source/drain regions SD spaced apart from each other in the y direction may be connected to each other by the conductive connection patterns STP. In one embodiment, the conductive connection patterns STP may be formed in such a way that top surfaces thereof are higher than those of the gate structure GS.

Figure 10A:
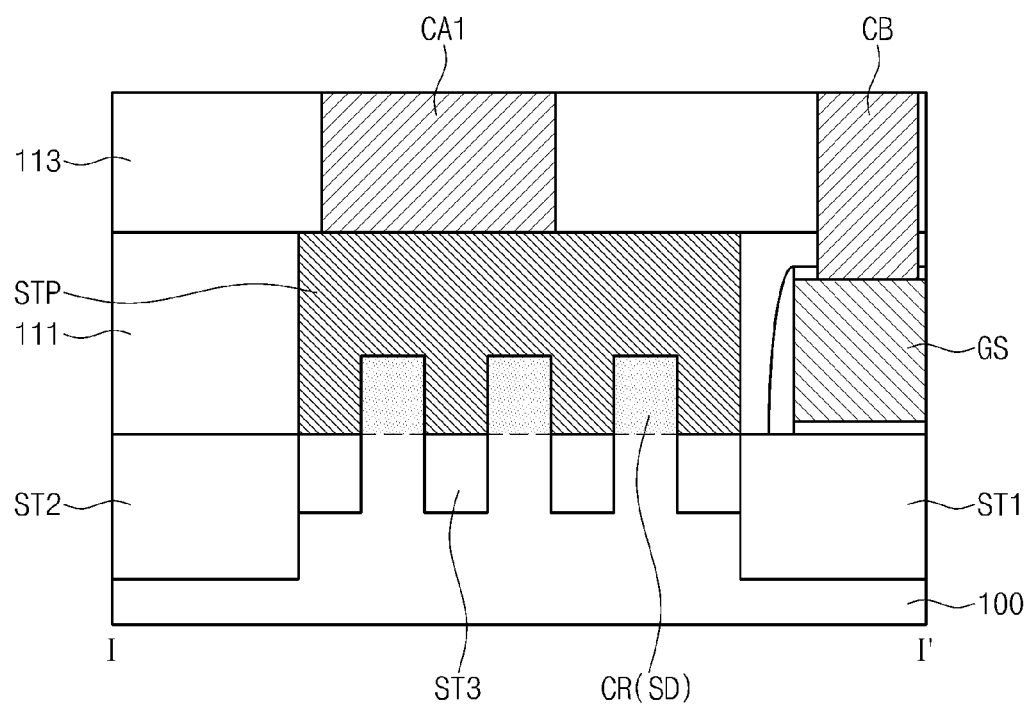
Figure 10B:
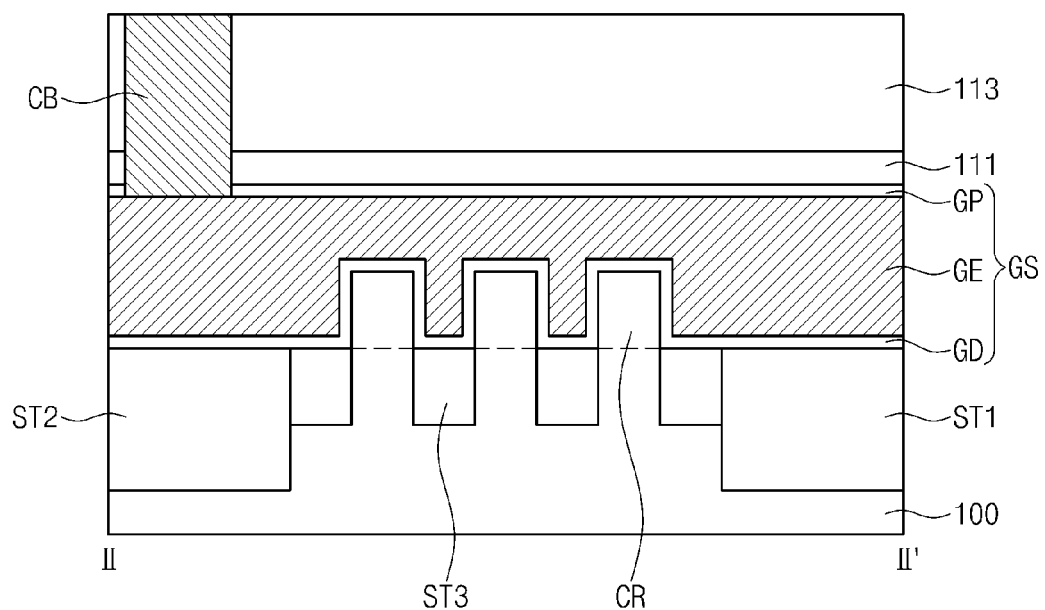
Figure 10C:
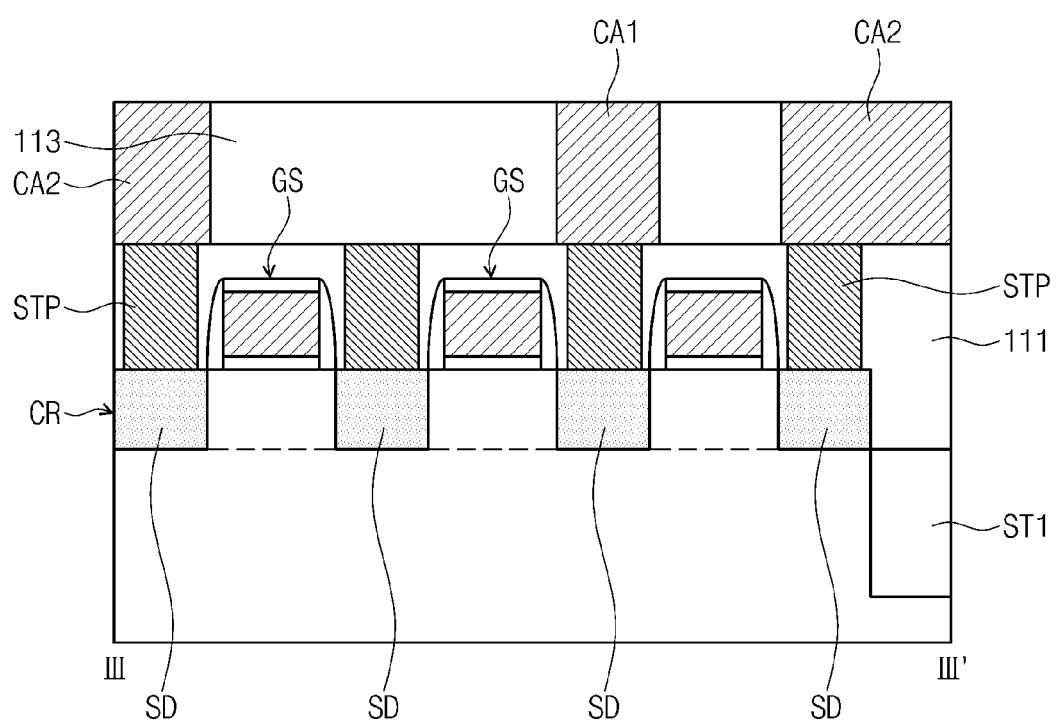

Referring to FIGS. 10A through 10C in conjunction with FIG. 2, the second interlayered insulating layer 113 may be formed on the structure provided with the conductive connection patterns STP, and the first contact plugs CA and the second contact plugs CB may be formed to penetrate the second interlayered insulating layer 113. For example, the formation of the first and second contact plugs CA and CB may include forming contact holes penetrating the second interlayered insulating layer 113 and then filling the contact holes with a conductive material. The second interlayered insulating layer 113 may include, for example, a silicon oxide layer or a silicon oxynitride layer. The first and second contact plugs CA and CB may include at least one of doped semiconductors, metals, or conductive metal nitrides. For example, the first and second contact plugs CA and CB may include at least one of copper (Cu), aluminum (Al), gold (Au), silver (Ag), tungsten (W), titanium (Ti), titanium nitride (TiN), or tungsten nitride (WN). The first and second contact plugs CA and CB may be formed, for example, using a chemical vapor deposition and/or a sputtering process.

The first contact plugs CA may be connected to the source/drain regions SD through the conductive connection patterns STP. The first contact plugs CA may include at least one of doped semiconductors, metals, or conductive metal nitrides. The first contact plugs CA may have various shapes. For example, at least one of the first contact plugs CA may be shaped like a bar extending along the y direction. Some of the first contact plugs CA may be formed to include a portion extending above the device isolation layer ST and connecting the source/drain region SD of the PMOSFET region PR to the source/drain region SD of the NMOSFET region NR. The first contact plugs CA connecting the source/drain regions SD of the PMOSFET and NMOSFET regions PR and NR may include a portion extending along the y direction and another portion extending along the x direction. The first contact plugs CA may include the common conductive contact plug CA1, which will be subsequently connected to the common conductive lines PW1 and PW2, and the individual conductive contact plugs CA2 which are plugs other than the common conductive contact plugs CA1.

The second contact plugs CB may be electrically connected to the gate structures GS. For example, the second contact plugs CB may be coupled to the gate structures GS via the second interlayered insulating layer 113 and the first interlayered insulating layer 111. The second contact plugs CB may include at least one of doped semiconductors, metals, or conductive metal nitrides, for example. The second contact plugs CB may be provided to form the arrangement described with reference to FIG. 3. For example, a pair of the second contact plugs CB adjacent to each other in the x direction may be separated from each other by the PMOSFET region PR or the NMOSFET region NR. The first contact plugs CA and the second contact plugs CB may be concurrently formed, but in other embodiments, they may be formed using separate processes.

Referring back to FIGS. 6A through 6C in conjunction with FIG. 2, the third interlayered insulating layer 115 may be formed on the structure provided with the first and second contact plugs CA and CB, and then, the first and second via plugs V1 and V2 may be formed to penetrate the third interlayered insulating layer 115. The first via plugs V1 may be coupled to the first contact plugs CA, and the second via plugs V2 may be coupled to the second contact plugs CB. The first and second via plugs V1 and V2 may be formed of at least one of doped semiconductors, metals, or conductive metal nitrides. In other example embodiments, the formation of the first and second via plugs V1 and V2 as well as the third interlayered insulating layer 115 may be omitted.

The fourth interlayered insulating layer 117 may be formed on the structure provided with the first and second via plugs V1 and V2, and then, the first wires M1 may be formed to penetrate the fourth interlayered insulating layer 117. The first wires M1 may include the first and second common conductive lines PW1 and PW2 connected to the common conductive contact plugs CA1 through the first via plugs V1, the first conductive lines CAL connected to the individual conductive contact plugs CA2 through the first via plugs V1, and the second conductive lines CBL connected to the second contact plugs CB through the second via plugs V2. As such, the first and second common conductive lines PW1 and PW2 and the first and second conductive lines CAL and CBL may be formed at the same vertical level from the substrate 100. The first wires M1 may include at least one of doped semiconductors, metals, and conductive metal nitrides. For example, the first wires M1 may include at least one of copper (Cu), aluminum (Al), gold (Au), silver (Ag), tungsten (W), titanium (Ti), titanium nitride (TiN), and tungsten nitride (WN).

Because the contact plugs CA and CB and the optional via plugs V1 and V2 are positioned in a vertical middle portion of the logic cells, the contact plugs CA and CB, or a combined contact plug with a corresponding via plug may be referred to generally herein as a mid-level conductive interconnect. The first wires M1, on the other hand, may be referred to herein as an upper-level conductive interconnect, and the conductive connection pattern STP may be referred to as a lower-level conductive interconnect. As such, the lower-level conductive interconnects may be positioned at a first vertical level of the logic cells, the mid-level conductive interconnects may be positioned at a second, higher, vertical level of the logic cells, and the upper-level conductive interconnects may be positioned at a third, even higher, vertical level of the logic cells.

Hereinafter, the process of forming the first wires M1 will be described in more detail.

Figure 11:
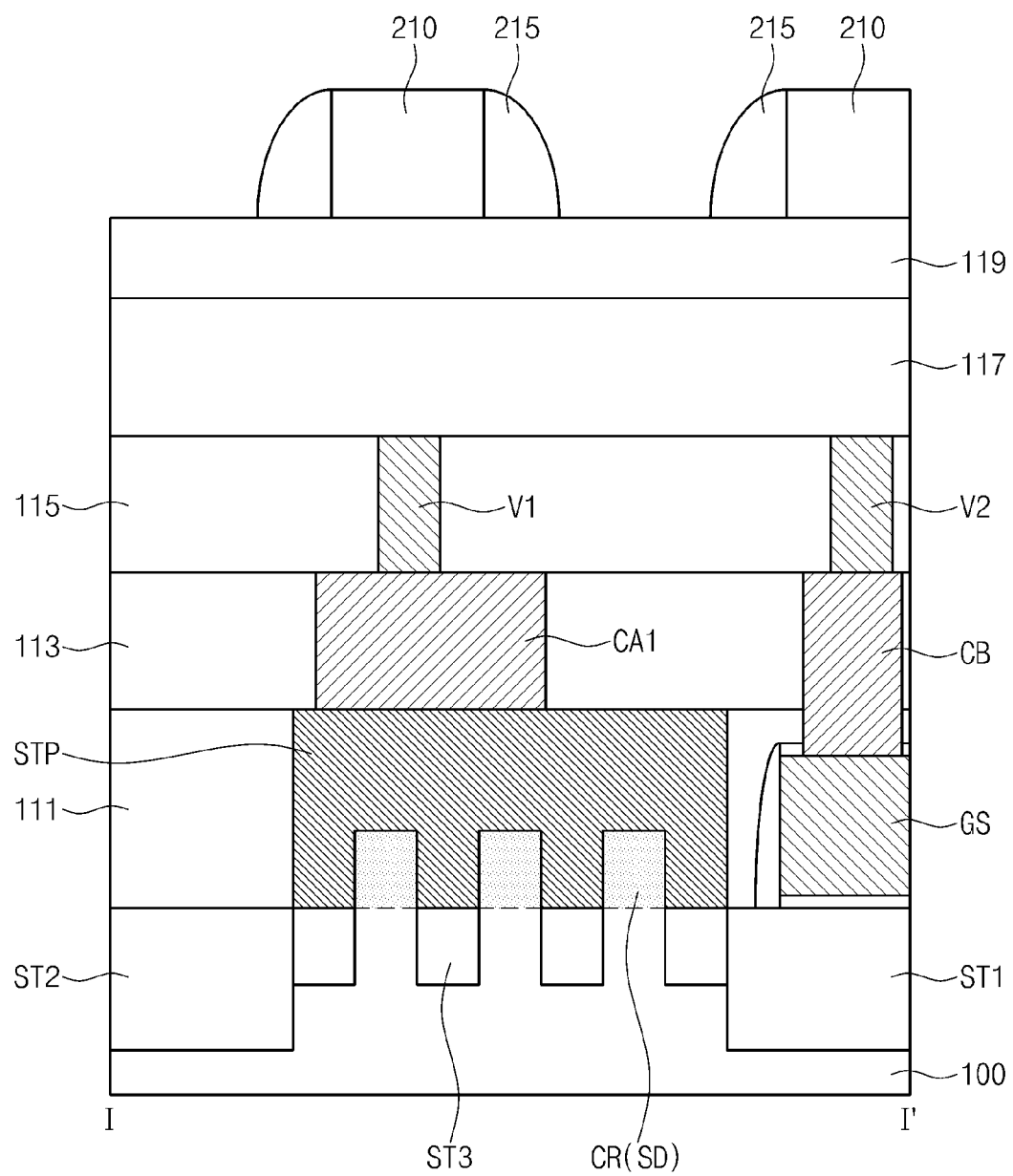
FIGS. 11 and 12 are sectional views illustrating a method of forming first wires, according to example embodiments of the inventive concept.
Figure 12:
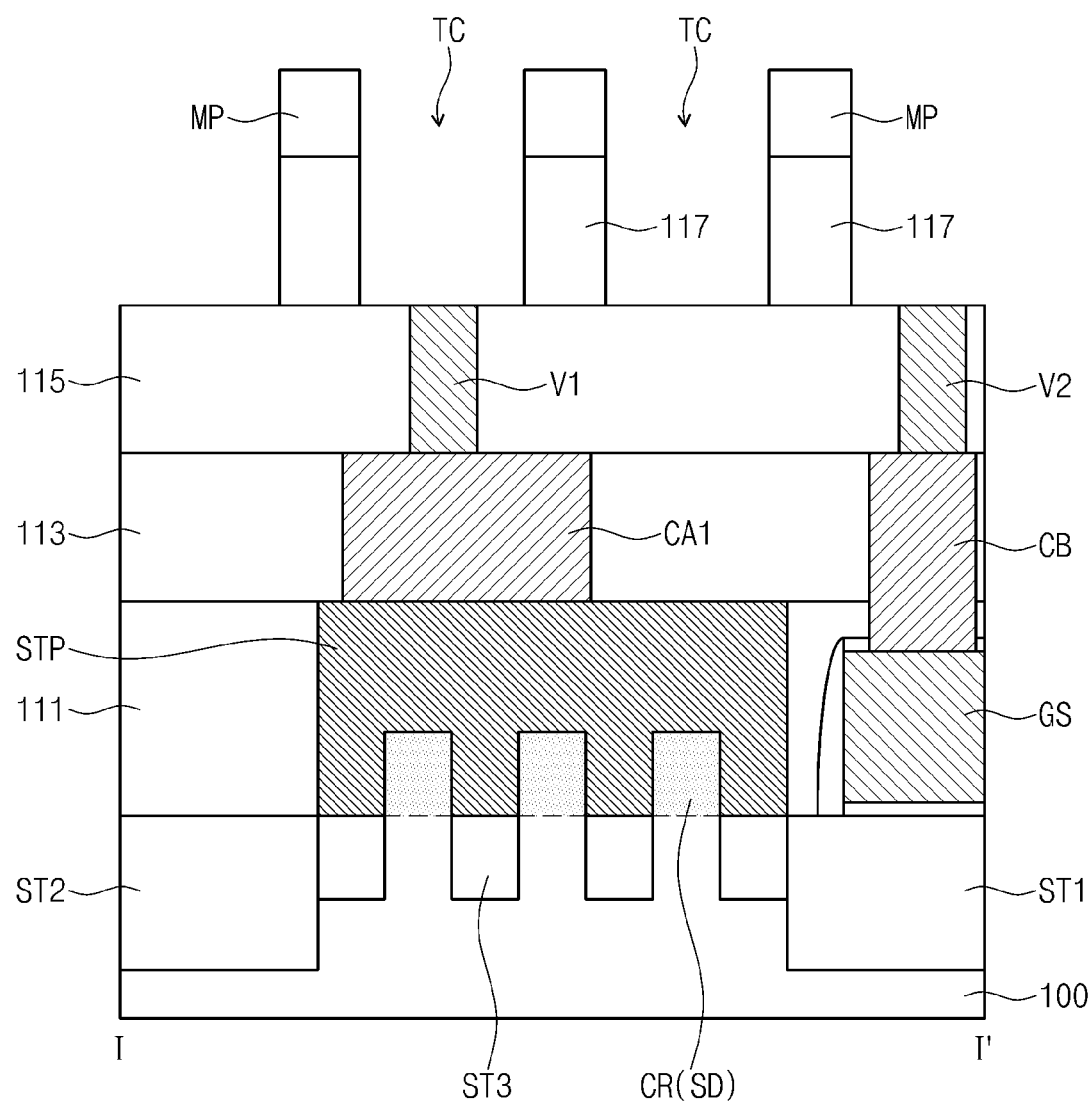

FIGS. 11 and 12 are sectional views illustrating a method of forming first wires, according to example embodiments of the inventive concept.

Referring to FIG. 11, the fourth interlayered insulating layer 117 and a mask layer 119 may be sequentially formed on the structure provided with the first and second via plugs V1 and V2. The mask layer 119 may include, for example, at least one of a silicon oxide layer, a silicon nitride layer, or a poly silicon layer. For example, the mask layer 119 may be provided in a multi-layered structure including a silicon oxide layer and/or a silicon nitride layer as well as a poly silicon layer thereon. Sacrificial patterns 210 may be formed on the mask layer 119. In example embodiments, the sacrificial patterns 210 may include a carbon-containing amorphous layer and/or an organic planarization layer (OPL).

The sacrificial patterns 210 may have the unidirectional structure parallel to the x direction. As an example, the sacrificial patterns 210 may be a plurality of line-shaped patterns extending along the x direction. In certain embodiments, a block mask may be provided on the mask layer 119 to cover the sacrificial patterns 210 that are provided on a region, on which the first wires M1 will not be formed.

Spacer patterns 215 may be formed on sidewalls of the sacrificial patterns 210. Each of the spacer patterns 215 may be formed along the sidewall of the sacrificial pattern 210, and thus, it may have the unidirectional structure. The formation of the spacer patterns 215 may include forming an insulating layer to conformally cover the structure provided with the sacrificial patterns 210, and then, performing an anisotropic etching process thereto. For example, the spacer patterns 215 may include at least one of a silicon oxide layer, a silicon oxynitride layer, or a silicon nitride layer. The spacer patterns 215 may be formed to expose certain top surfaces of the sacrificial patterns 210. In certain embodiments, the sacrificial patterns 210 and the spacer patterns 215 may be formed using a deposition technique such as a chemical vapor deposition (CVD), a physical vapor deposition (PVD), or an atomic layer deposition (ALD).

Referring to FIG. 12, the sacrificial patterns 210 are removed. The removal of the sacrificial patterns 210 may be performed using, for example, a selective etching process. After the removal of the sacrificial patterns 210, the mask layer 119 may be patterned using the spacer patterns 215 as an etch mask to form mask patterns MP. Thereafter, the fourth interlayered insulating layer 117 may be patterned using the mask patterns MP as an etch mask to form recess regions TC exposing the first and second via plugs V1 and V2. The first wires M1 may be formed by filling the recess regions TC with a conductive material.

The spacer patterns 215 may be formed to have a width smaller than those of the sacrificial patterns 210, and thus, the mask patterns MP formed by the spacer patterns 215 can be formed to have a pitch smaller than a minimum pitch that can be realized by a photolithography process. As a result, a density of the first wires M1 can be increased, compared with the case where the first wires are formed using the photolithography process. The patterning method, in which the sacrificial and spacer patterns are used, may be called a double patterning technology (DPT), but the method described with reference to FIGS. 11 and 12 may be variously modified.

The use of the double patterning technology allows for a semiconductor device to have an integration density higher than that of the case of using the conventional photolithography process. However, in the double patterning technology, a mask layer may be patterned using spacer patterns on sidewalls of the sacrificial patterns or additional insulating patterns between the spacer patterns, not by the sacrificial patterns, as an etch mask. Accordingly, in the case of wires of the multidirectional structure, there is a difficulty in precisely etching a portion, at which two patterns extending along different directions are intersected, when the double patterning technology is used. It may be necessary to increase an integration density of wires for a semiconductor device with a higher integration density or about sub 14-nm technology nodes, but owing to the above issues, the double patterning technology has been limitedly used.

According to example embodiments of the inventive concept, the first wires M1 are formed to have the unidirectional structure. Accordingly, the sacrificial patterns 210 for forming the first wires M1 can be formed to have the unidirectional structure, and thus, the first wires M1 with a fine pitch can be formed using the double patterning technology, without the technological problems occurring in a process of forming the wires of the multidirectional structure.

Figure 13:
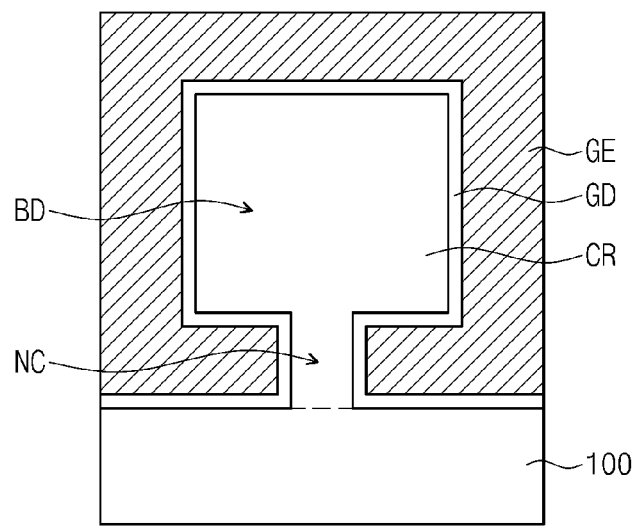
FIG. 13 is a sectional view schematically illustrating an active portion of a semiconductor device, according to other example embodiments of the inventive concept.

As described above, each of the active portions CR may have a fin-shaped structure, but the structure thereof may be variously changed. FIG. 13 is a sectional view schematically illustrating an active portion of a semiconductor device, according to other example embodiments of the inventive concept. In the embodiment shown in FIG. 13, the active portion CR may be configured to have an omega-shaped structure including a neck portion NC adjacent to the substrate 100 and a body portion BD wider than the neck portion NC, when viewed in a vertical section. A gate insulating layer GD and a gate electrode GE may be provided to cover sequentially the active portion CR. The gate electrode GE may include a portion extending below the body portion BD of the active portion CR.

Figure 14:
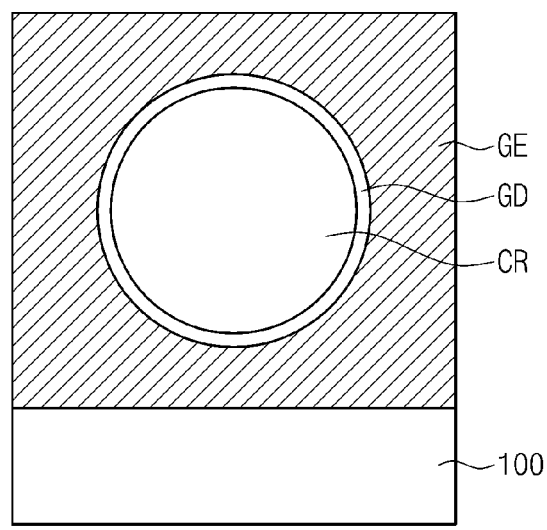
FIG. 14 is a sectional view schematically illustrating an active portion of a semiconductor device, according to still other example embodiments of the inventive concept.

FIG. 14 is a sectional view schematically illustrating an active portion of a semiconductor device, according to still other example embodiments of the inventive concept. In the embodiment shown in FIG. 14, the active portion CR may be provided in the form of a nanowire spaced apart from the substrate 100. A gate insulating layer GD and a gate electrode GE may be provided to cover sequentially the active portion CR. The gate electrode GE may include a portion interposed between the active portion CR and the substrate 100.

Figure 15:
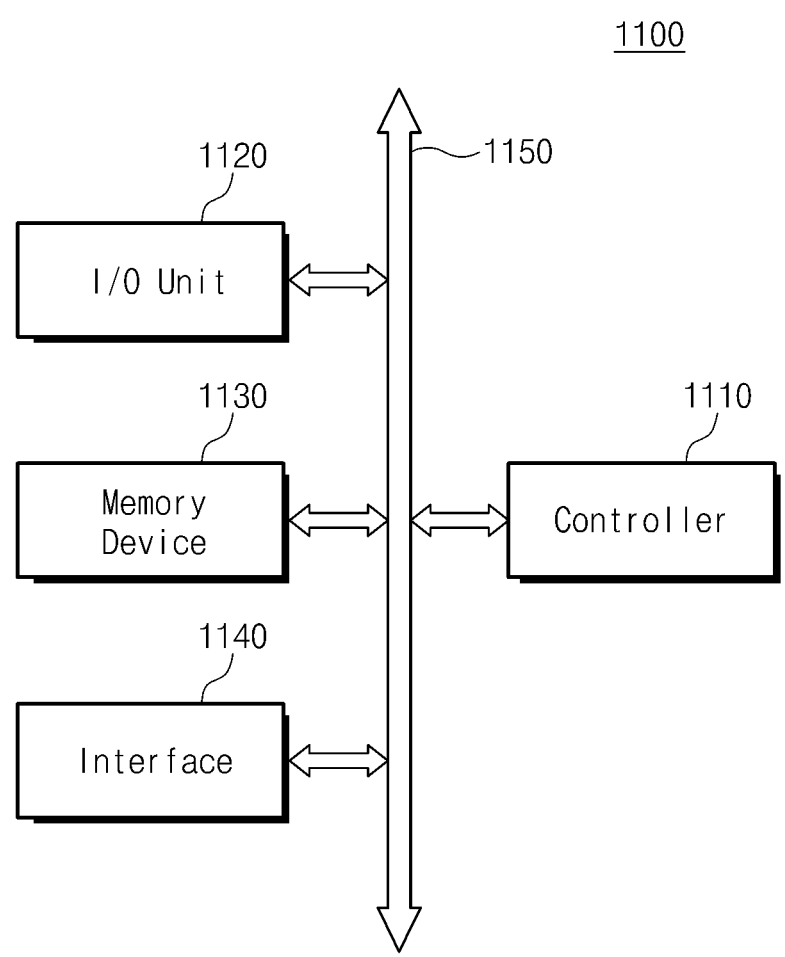
FIG. 15 is a schematic block diagram illustrating an example of electronic systems including a semiconductor device according to example embodiments of the inventive concept.

FIG. 15 is a schematic block diagram illustrating an example of electronic systems including a semiconductor device according to example embodiments of the inventive concept.

Referring to FIG. 15, an electronic system 1100 may include a controller 1110, an input-output (I/O) unit 1120, a memory device 1130, an interface 1140, and a bus 1150. The controller 1110, the input-output unit 1120, the memory device 1130 and/or the interface 1140 may be connected or coupled to each other via the bus 1150 serving as a pathway for data communication.

The controller 1110 may include, e.g., at least one of a microprocessor, a digital signal processor, a microcontroller, or another logic device. The other logic device may have a similar function to any one of the microprocessor, the digital signal processor, and the microcontroller. The input-output unit 1120 may include a keypad, keyboard, a display device, and so forth. The memory device 1130 may be configured to store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110. A semiconductor device according to example embodiments of the inventive concept may be provided in the memory device 1130 or may be provided as a part of the controller 1110 and/or the I/O unit 1120.

The semiconductor device may be part of an electronic device, such as a semiconductor memory chip or semiconductor logic chip, a stack of such chips, a semiconductor package including a package substrate and one or more semiconductor chips, a package-on-package device, or a semiconductor memory module, for example. In the case of memory, the semiconductor device may be part of a volatile or non-volatile memory.

The electronic system 1100 may be applied to, for example, a personal digital assistant (PDA), a portable computer, a web tablet, a wireless phone, a mobile phone, a digital music player, a memory card, or other electronic products. The other electronic products may receive or transmit information data by wireless communication or wired communication.

According to example embodiments of the inventive concept, a semiconductor device may include first wires configured to have a unidirectional structure. Accordingly, the semiconductor device can have an increased integration density. In the semiconductor device, by changing disposition or arrangement of contact plugs coupled to a gate structure, it is possible to easily form contact plugs of a fine pitch. A common conductive line may be provided to have a not-shared structure, and this makes it possible to improve electric characteristics of the semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate including a plurality of logic cells, wherein each of the plurality of logic cells comprises a plurality of active portions provided on the substrate to extend along a first direction and be spaced apart from each other along a second direction crossing the first direction, and gate structures extending along the second direction spaced apart from each other along the first direction;
source/drain regions on the plurality of active portions at opposite sides of each of the gate structures;
contact plugs located at a first vertical level of the semiconductor device, wherein the contact plugs comprise first contact plugs connected to the source/drain regions and second contact plugs connected to the gate structures, at least one of the first contact plugs extending along the second direction and electrically connecting adjacent ones of the source/drain regions with each other, the adjacent ones of the source/drain regions spaced apart from each other in the second direction;
first via plugs in contact with top surfaces of the contact plugs, the first via plugs located at a second vertical level of the semiconductor device further from the substrate than the first vertical level; and
first wires in contact with top surfaces of the first via plugs, the first wires located at a third vertical level of the semiconductor device further from the substrate than the second vertical level,
wherein at least one of the first wires are connected in common to the plurality of logic cells through the contact plugs,
wherein all of the first wires consist of a straight line shape extending parallel to a specific direction, and
wherein each of the plurality of logic cells comprises a PMOSFET region and an NMOSFET region, and in at least one of the logic cells, an adjacent pair of the second contact plugs are spaced apart from each other with the PMOSFET region and/or the NMOSFET region interposed therebetween.

2. A semiconductor device, comprising:
a substrate including a plurality of logic cells, wherein each of the plurality of logic cells comprises a plurality of active portions provided on the substrate to extend along a first direction and be spaced apart from each other along a second direction crossing the first direction, device isolation patterns provided at opposite sides of each of the plurality of active portion to extend along the first direction, and gate structures extending along the second direction spaced apart from each other along the first direction:
transistors provided in each of the plurality of logic cells;
contact plugs connected to electrodes of the transistors, the contact plugs located at a first vertical level of the semiconductor device, wherein the contact plugs comprise first contact plugs connected to the plurality of active portions and second contact plugs connected to the gate structures;
first via plugs in contact with top surfaces of the contact plugs; the first via plugs located at a second vertical level of the semiconductor device further from the substrate than the first vertical level; and
first wires in contact with top surfaces of the first via plugs; the first wires located at a third vertical level of the semiconductor device further from the substrate than the second vertical level,
wherein at least one of the first wires are connected in common to the plurality of logic cells through the contact plugs,
wherein all of the first wires consist of a straight line shape extending parallel to a specific direction, and
wherein each of the plurality of logic cells comprises a PMOSFET region and an NMOSFET region, and in at least one of the logic cells, an adjacent pair of the second contact plugs are spaced apart from each other with the PMOSTET region and/or the NMOSFET region interposed therebetween,
wherein each of the plurality of active portions comprises upper sidewalls exposed by the device isolation patterns.

3. The semiconductor device of claim 1, wherein the first wires extend parallel to the first direction.

4. The semiconductor device of claim 1, wherein some of the second contact plugs are provided between the plurality of logic cells.

5. A semiconductor device comprising:
a substrate including a plurality of logic cells;
transistors provided in the plurality of logic cells;
contact plugs connected to electrodes of the transistors, the contact plugs located at a first vertical level of the semiconductor device, the contact plugs including first contact plugs connected to a plurality of active portions disposed below the first vertical level and second contact plugs connected to a plurality of gate structures disposed below the first vertical level, at least one of the first contact plugs electrically connecting adjacent ones of the plurality of active portions with each other, the adjacent ones of the plurality of active portions spaced apart from each other;
first via plugs in contact with top surfaces of the contact plugs, the first via plugs located at a second vertical level of the semiconductor device further from the substrate than the first vertical level; and
first wires in contact with top surfaces of the first via plugs, the first wires located at a third vertical level of the semiconductor device further from the substrate than the second vertical level,
wherein at least one of the first wires are connected in common to the plurality of logic cells through the contact plugs,
wherein all of the first wires have of a straight line shape extending parallel to a specific direction, and
wherein each of the plurality of logic cells comprises a PMOSFET region and an NMOSFET region, and the second contact plugs comprise:
a first sub-contact plug between the PMOSFET and NMOSFET regions;
a separate second sub-contact plug between the PMOSFET region and one of the logic cells adjacent thereto; and
a separate third sub-contact plug between the NMOSFET region and one of the logic cells adjacent thereto,
wherein each sub-contact plug contacts a separate respective transistor gate structure disposed below the first level, and the first, second, and third sub-contact plugs are not all aligned in the specific direction.

6. The semiconductor device of claim 5, wherein, in at least one of the logic cells, an adjacent pair of the second contact plugs are two different ones selected from the first, second, and third sub-contact plugs.

7. The semiconductor device of claim 1, wherein the plurality of logic cells comprise a first logic cell, a second logic cell separated from the first logic cell in a first direction, and a third logic cell separated from the first logic cell in a second direction crossing the first direction, and
the first wires include a common conductive line shared by the first and second logic cells but not by the first and third logic cells.

8. The semiconductor device of claim 1, wherein:
the first wires comprise:
a first common conductive line overlapped with a plurality of PMOSFET regions; and
a second common conductive line overlapped with a plurality of NMOSFET regions.

9. The semiconductor device of claim 1, wherein the first wires comprise:
conductive lines connected to the second contact plugs, and
common conductive lines connected to the first contact plugs and parallel to the conductive lines.

10. The semiconductor device of claim 1, further comprising:
second via plugs on the first wires; and
second wires in contact with top surfaces of the second via plugs,
wherein the second wires extend along a direction crossing the specific direction and are at a fourth vertical level further from the substrate than the third vertical level.

* * * * *